US012696524B2

(12) United States Patent
Chen et al.

(10) Patent No.: US 12,696,524 B2
(45) Date of Patent: Jul. 28, 2026

(54) STACKED TRANSISTOR ISOLATION FEATURES AND METHODS OF FORMING THE SAME

(71) Applicant: Taiwan Semiconductor Manufacturing Co., Ltd., Hsinchu (TW)

(72) Inventors: Chun Wei Chen, Hsinchu (TW); Zheng Hui Lim, Hsinchu (TW); Yen Chuang, Baoshan Township (TW); Shun-Siang Jhan, Kaohsiung City (TW); Yi-Ching Hung, Hsinchu (TW); Ji-Yin Tsai, Zhudong Township (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 450 days.

(21) Appl. No.: 18/354,954

(22) Filed: Jul. 19, 2023

(65) Prior Publication Data

US 2025/0031435 A1     Jan. 23, 2025

(51) Int. Cl.
| | |
|---|---|
| *H10D 84/03* | (2025.01) |
| *H10D 84/01* | (2025.01) |

(52) U.S. Cl.
CPC ....... *H10D 84/038* (2025.01); *H10D 84/0167* (2025.01); *H10D 84/017* (2025.01); *H10D 84/0172* (2025.01); *H10D 84/0188* (2025.01)

(58) Field of Classification Search
CPC ............. H10D 84/0172; H10D 30/019; H10D 30/501; H10D 84/0177; H10D 84/851; H10D 88/00; H10D 88/01; B82Y 10/00
See application file for complete search history.

(56) References Cited

U.S. PATENT DOCUMENTS

| | | | |
|---|---|---|---|
| 9,685,539 B1 * | 6/2017 | Cheng | ................... H10D 30/62 |
| 2019/0287864 A1 | 9/2019 | Cheng et al. | |
| 2020/0266060 A1 | 8/2020 | Cheng et al. | |
| 2022/0045178 A1 * | 2/2022 | Lee | ...................... H10D 64/017 |
| 2022/0189771 A1 * | 6/2022 | Lee | ...................... C23C 16/466 |
| 2023/0352528 A1 * | 11/2023 | Park | .................. H10D 84/0128 |
| 2023/0411477 A1 * | 12/2023 | Fan | .................. H01L 21/28518 |

OTHER PUBLICATIONS

Ogryzlo et al., "Doping and crystallographic effects in CI-atom etching of silicon," Journal of Applied Physics, vol. 67, No. 6, Research Article, Mar. 15, 1990, pp. 3115-3120.

* cited by examiner

*Primary Examiner* — Fernando L Toledo
*Assistant Examiner* — Adam S Bowen
(74) *Attorney, Agent, or Firm* — Slater Matsil, LLP

(57)     ABSTRACT

In an embodiment, a method includes: patterning a lower semiconductor nanostructure, an upper semiconductor nanostructure, and a dummy nanostructure, the dummy nanostructure disposed between the lower semiconductor nanostructure and the upper semiconductor nanostructure, the dummy nanostructure including doped silicon; forming an opening between the lower semiconductor nanostructure and the upper semiconductor nanostructure by etching the doped silicon of the dummy nanostructure; forming an isolation structure in the opening; and depositing a gate dielectric around the isolation structure, the upper semiconductor nanostructure, and the lower semiconductor nanostructure.

20 Claims, 13 Drawing Sheets

56U
54A
56U
54A
56U
54B
56L
54A
56L
54A
56L
54A

52

50

STACKED TRANSISTOR ISOLATION FEATURES AND METHODS OF FORMING THE SAME

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
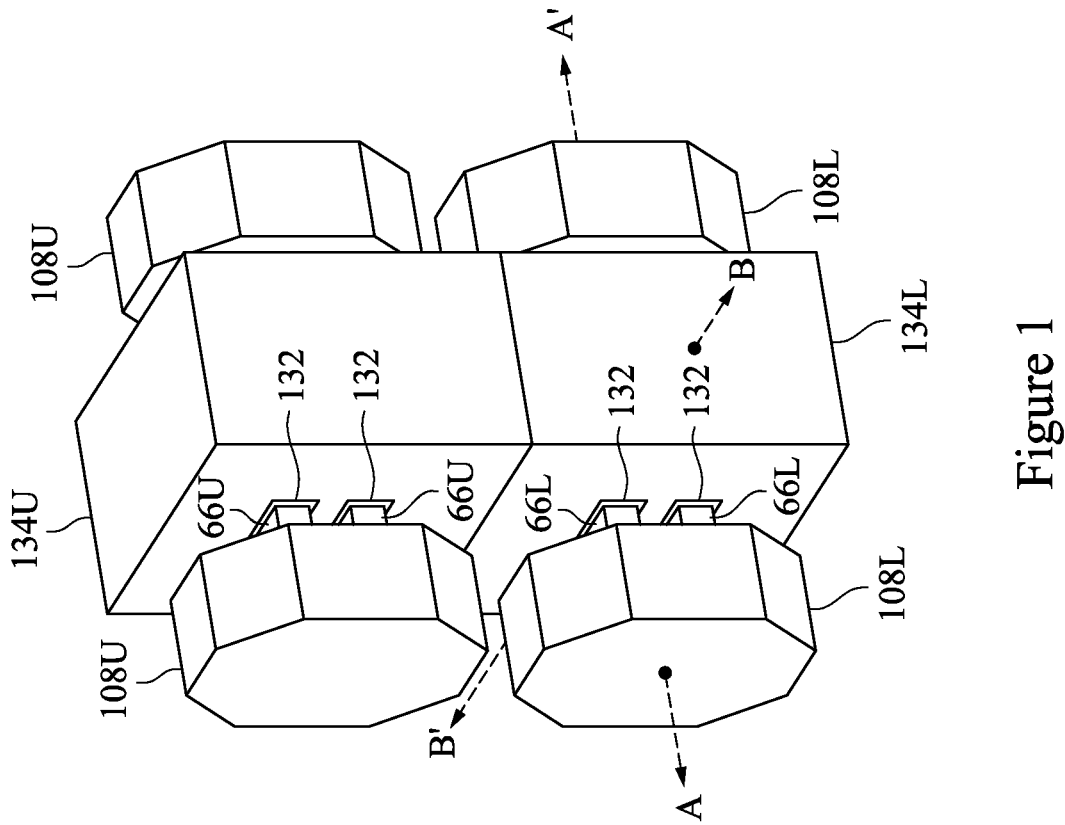
FIG. 1 illustrates an example schematic of a stacked transistor, such as a complementary field-effect transistor (CFET), in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, CFETs are formed. A CFET includes a lower nanostructure-FET and an upper nanostructure-FET. An isolation structure (also referred to as a nanostructure isolation material) is formed between the nanostructures of a lower nanostructure-FET and the nanostructures of an upper nanostructure-FET. The isolation structure may be formed by initially forming a dummy nanostructure in a multi-layer stack, and then at least partially replacing the dummy nanostructure with the isolation structure after subsequent processing of the multi-layer stack. In some embodiments, the dummy nanostructure is formed of doped silicon, which may advantageously reduce the risk of generating defects in the multi-layer stack while still providing good etch selectivity and insulating properties. As a result, device performance and manufacturing ease of the completed CFETs can be improved.

FIG. 1 illustrates an example schematic of a stacked transistor, such as a complementary field-effect transistor (CFET), in accordance with some embodiments. FIG. 1 is a three-dimensional view, where some features of the CFETs are omitted for illustration clarity.

The CFETs include multiple vertically stacked nanostructure-FETs (e.g., nanowire FETs, nanosheet FETs, multi bridge channel (MBC) FETs, nanoribbon FETs, gate-all-around (GAA) FETs, or the like). For example, a CFET may include a lower nanostructure-FET of a first device type (e.g., n-type/p-type) and an upper nanostructure-FET of a second device type (e.g., p-type/n-type) that is opposite the first device type. Specifically, the CFET may include a lower PMOS transistor and an upper NMOS transistor, or the CFET may include a lower NMOS transistor and an upper PMOS transistor. Each of the nanostructure-FETs include semiconductor nanostructures 66 (including lower semiconductor nanostructures 66L and upper semiconductor nanostructures 66U), where the semiconductor nanostructures 66 act as channel regions for the nanostructure-FETs. The semiconductor nanostructures 66 may be nanosheets, nanowires, or the like. The lower semiconductor nanostructures 66L are for a lower nanostructure-FET and the upper semiconductor nanostructures 66U are for an upper nanostructure-FET. A channel isolation material (not explicitly illustrated in FIG. 1, see FIGS. 12A-12B) may be used to separate and electrically isolate the upper semiconductor nanostructures 66U from the lower semiconductor nanostructures 66L.

Gate dielectrics 132 are along top surfaces, sidewalls, and bottom surfaces of the semiconductor nanostructures 66. Gate electrodes 134 (including a lower gate electrode 134L and an upper gate electrode 134U) are over the gate dielectrics 132 and around the semiconductor nanostructures 66. Source/drain regions 108 (including lower epitaxial source/drain regions 108L and upper epitaxial source/drain regions 108U) are disposed at opposing sides of the gate dielectrics 132 and the gate electrodes 134. Source/drain region(s) 108 may refer to a source or a drain, individually or collectively dependent upon the context. Isolation features may be formed to separate desired ones of the source/drain regions 108 and/or desired ones of the gate electrodes 134. For example, a lower gate electrode 134L may optionally be separated from an upper gate electrode 134U. Alternatively, a lower gate electrode 134L may be coupled to an upper gate electrode 134U. Further, the upper epitaxial source/drain regions 108U may be separated from lower epitaxial source/drain regions 108L by one or more dielectric layers (not explicitly illustrated in FIG. 1, see FIGS. 12A-12B). The isolation features between channel regions, gates, and source/drain regions allow for vertically stacked transistors, thereby improving device density. Because of the vertically stacked nature of CFETs, the schematic may also be referred to as stacked transistors or folding transistors.

FIG. 1 further illustrates reference cross-sections that are used in later figures. Cross-section A-A' is parallel to a longitudinal axis of the semiconductor nanostructures 66 of a CFET and in a direction of, for example, a current flow between the source/drain regions 108 of the CFET. Cross-section B-B' is perpendicular to cross-section A-A' and along a longitudinal axis of a gate electrode 134 of a CFET. Subsequent figures refer to these reference cross-sections for clarity.

Figure 2:
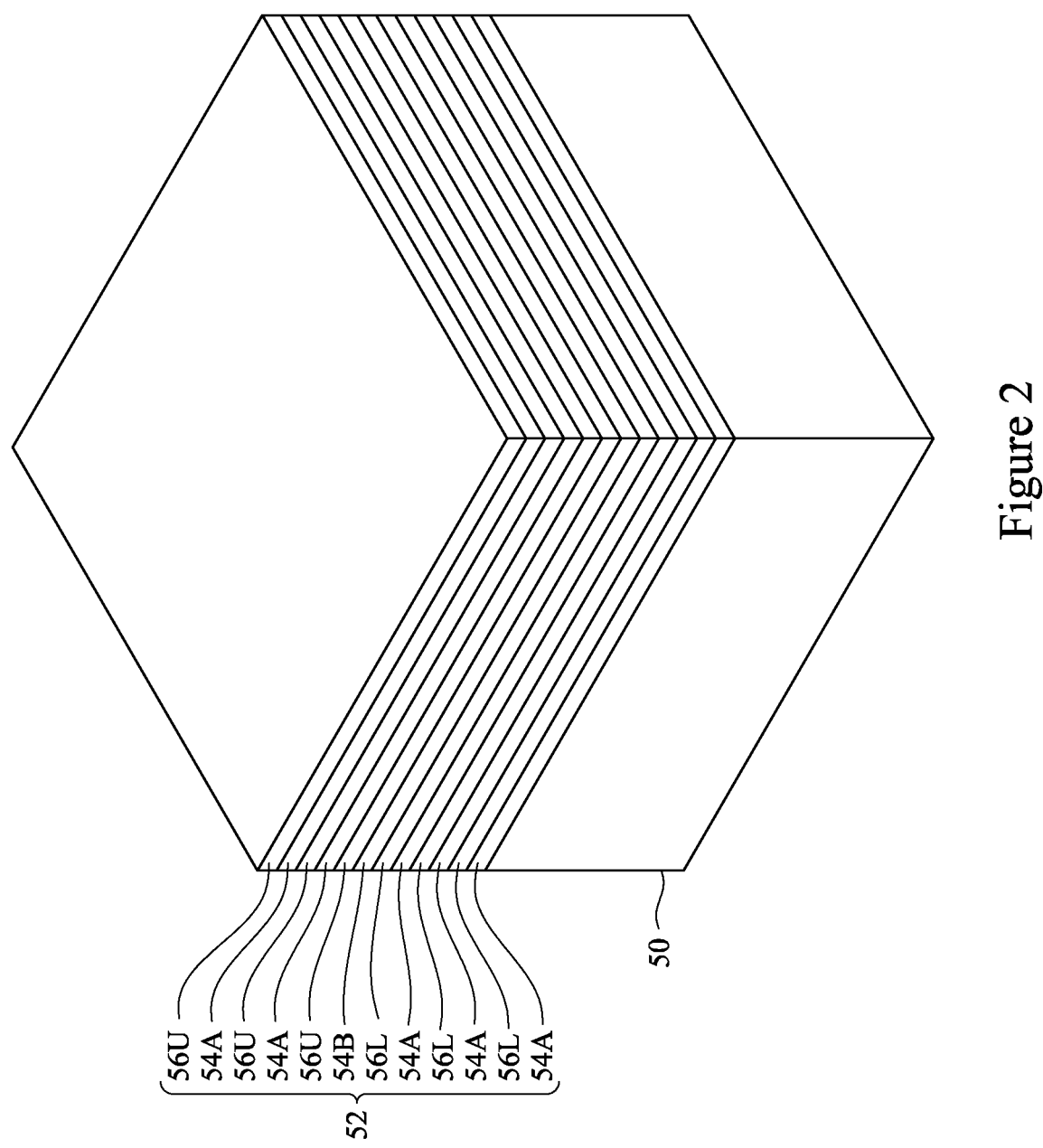
FIGS. 2-12B are views of intermediate stages in the manufacturing of CFETs, in accordance with some embodiments.
Figure 3:
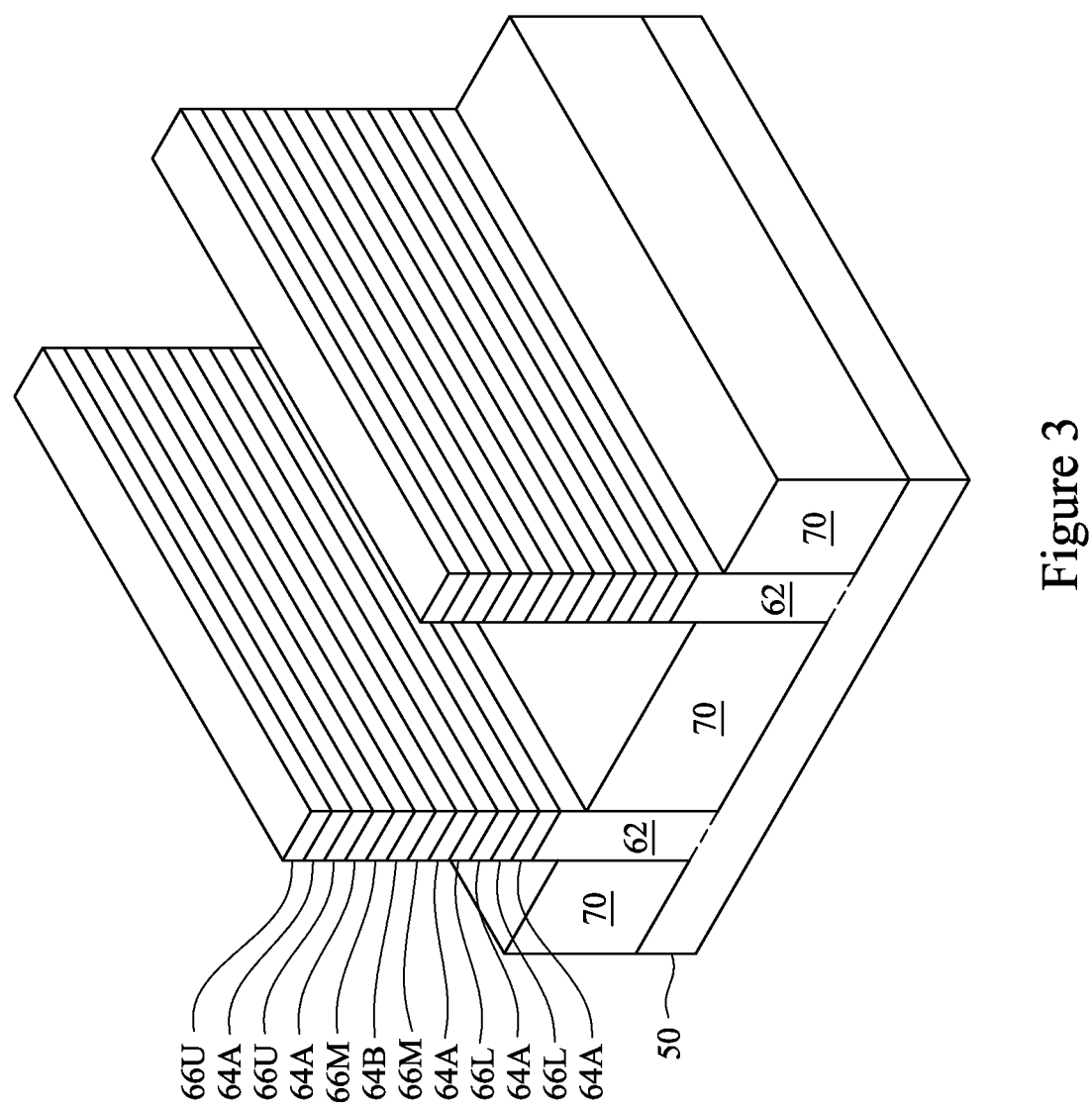
Figure 4:
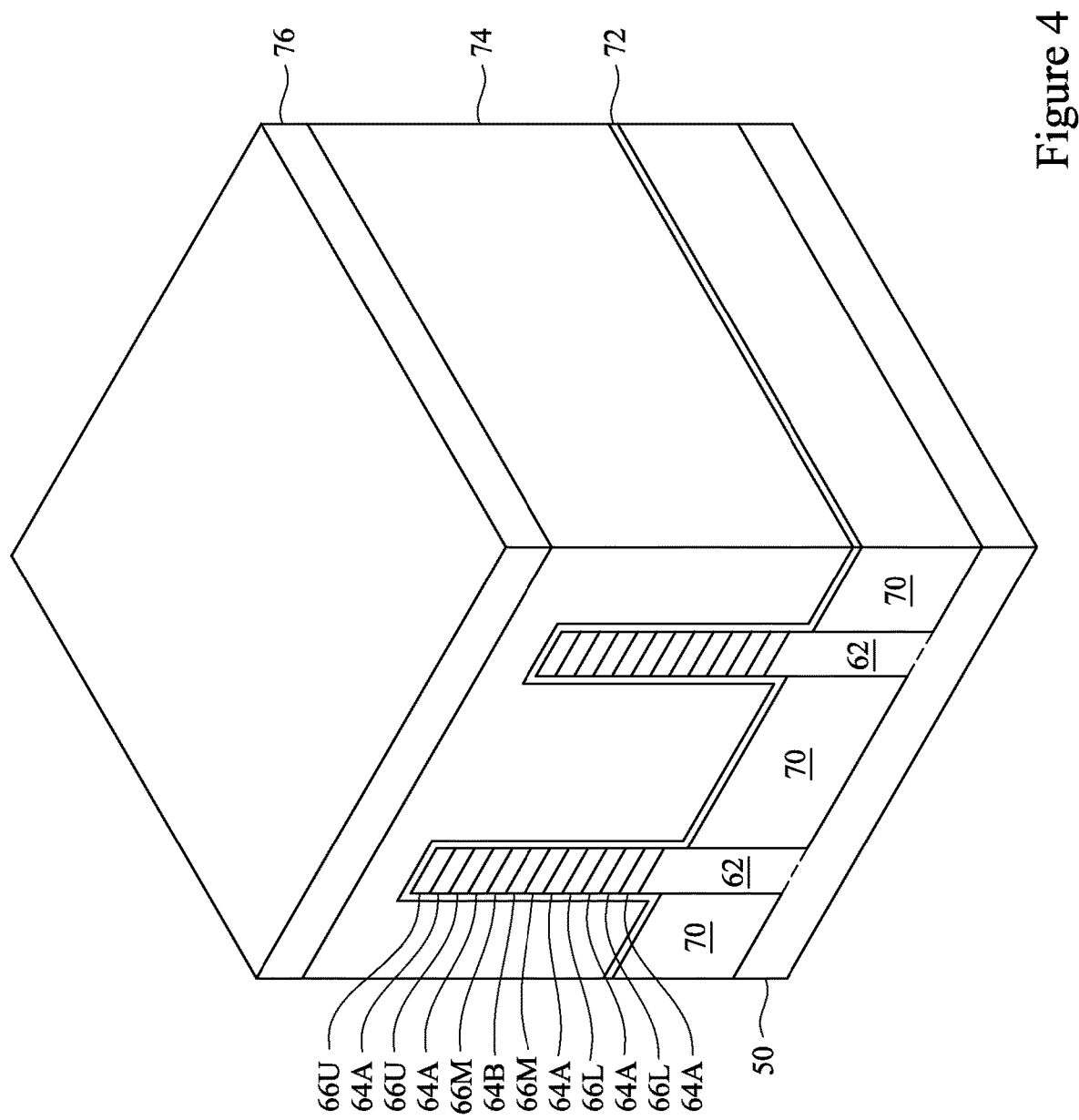
Figure 10:
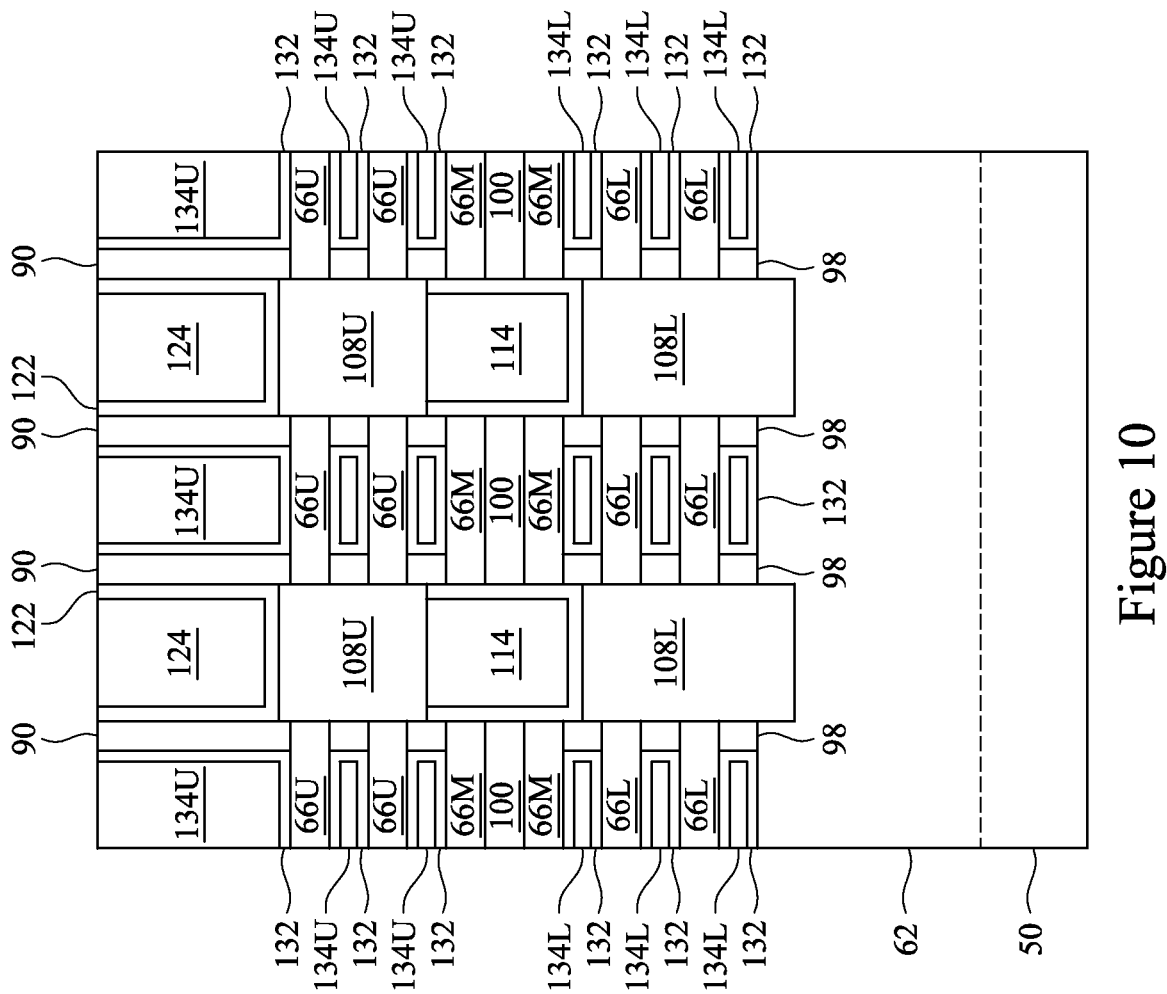
Figure 11:
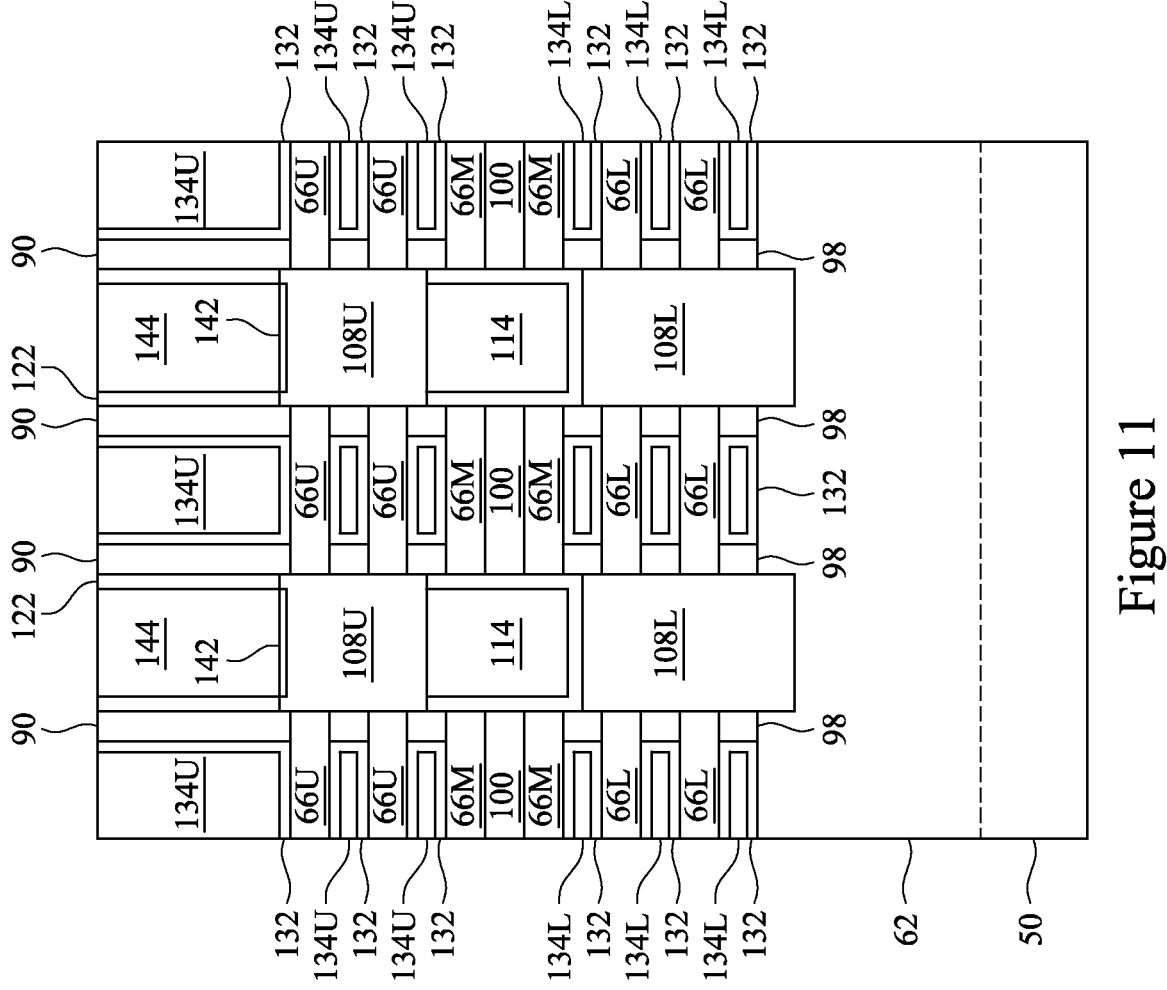
Figure 12A:
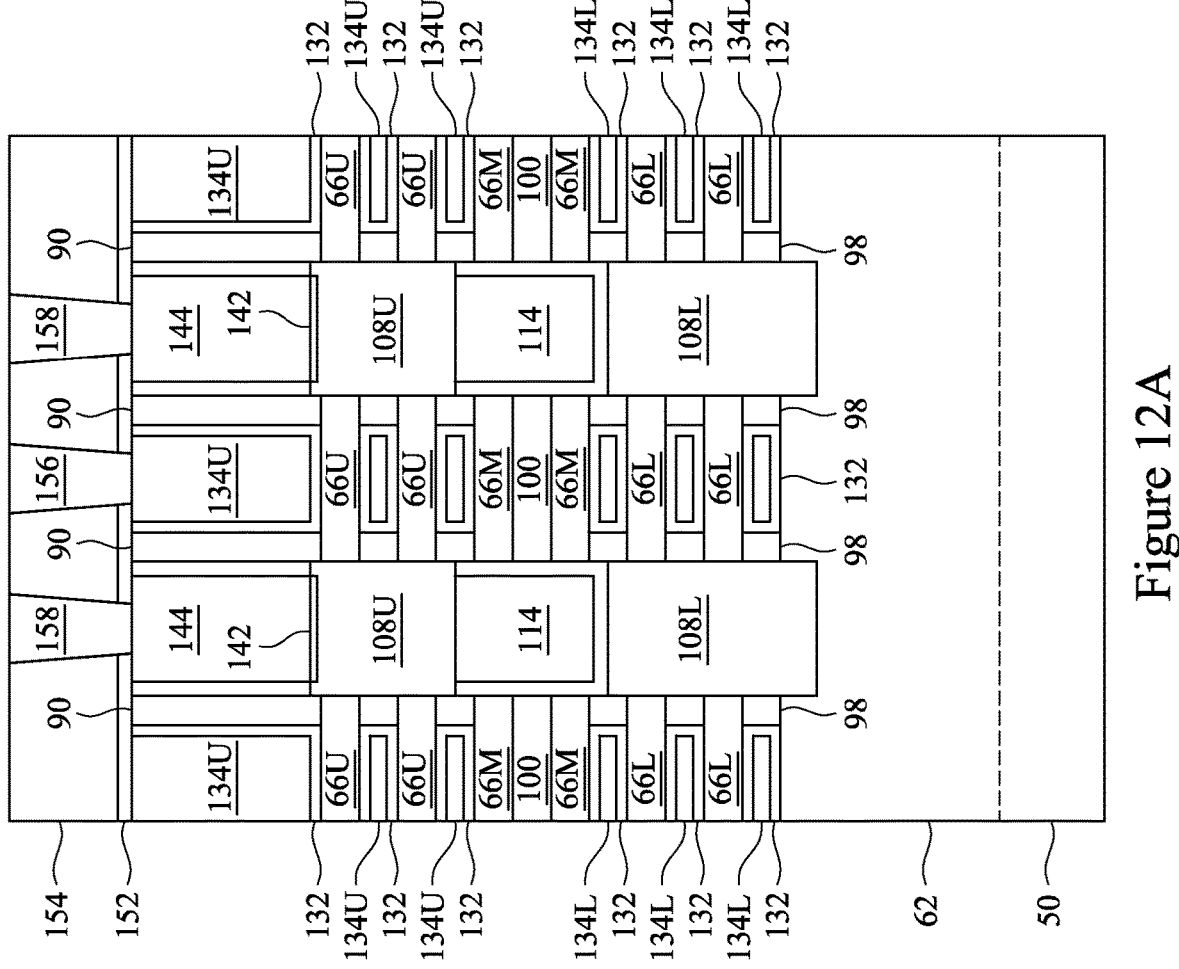
Figure 12B:
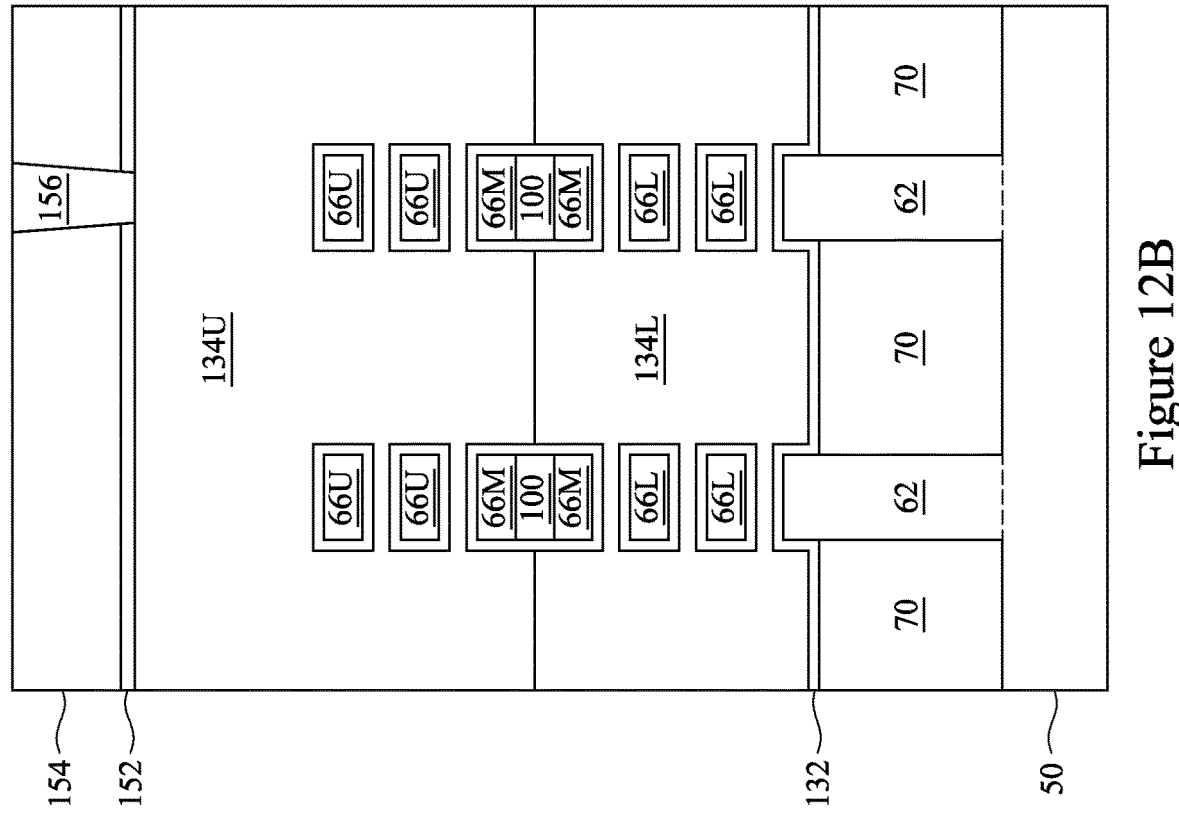

FIGS. 2-12B are views of intermediate stages in the manufacturing of CFETs, in accordance with some embodiments. FIGS. 2, 3, and 4 are three-dimensional views showing a similar three-dimensional view as FIG. 1. FIGS. 5, 6, 7, 8, 9, 10, 11, and 12A illustrate cross-sectional views along a similar cross-section as reference cross-section A-A' in FIG. 1. FIG. 12B illustrates a cross-sectional view along a similar cross-section as reference cross-section B-B' in FIG. 1.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including carbon-doped silicon, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

A multi-layer stack 52 is formed over the substrate 50. The multi-layer stack 52 includes alternating dummy layers 54 (including first dummy layers 54A and a second dummy layer 54B) and semiconductor layers 56 (including lower semiconductor layers 56L and upper semiconductor layers 56U). The lower semiconductor layers 56L and a subset of the first dummy layers 54A are disposed below the second dummy layer 54B. The upper semiconductor layers 56U and another subset of the first dummy layers 54A are disposed above the second dummy layer 54B. As subsequently described in greater detail, the dummy layers 54 will be removed and the semiconductor layers 56 will be patterned to form channel regions of CFETs. Specifically, the lower semiconductor layers 56L will be patterned to form channel regions of the lower nanostructure-FETs of the CFETs, and the upper semiconductor layers 56U will be patterned to form channel regions of the upper nanostructure-FETs of the CFETs.

The multi-layer stack 52 is illustrated as including a specific number of the dummy layers 54 and a specific number of the semiconductor layers 56. It should be appreciated that the multi-layer stack 52 may include any number of the dummy layers 54 and the semiconductor layers 56. Each layer of the multi-layer stack 52 may be grown by a process such as vapor phase epitaxy (VPE) or molecular beam epitaxy (MBE), deposited by a process such as chemical vapor deposition (CVD) or atomic layer deposition (ALD), or the like.

The first dummy layers 54A are formed of a first semiconductor material, and the second dummy layer 54B is formed of a second semiconductor material. The first and second semiconductor materials may be selected from the candidate semiconductor materials of the substrate 50. The semiconductor materials of the first dummy layers 54A and the second dummy layer 54B will be subsequently described in greater detail. The first and second semiconductor materials have a high etching selectivity to one another. As such, the material of the second dummy layer 54B may be removed at a faster rate than the material of the first dummy layers 54A in subsequent processing.

The semiconductor layers 56 (including the lower semiconductor layers 56L and upper semiconductor layers 56U) are formed of one or more semiconductor material(s). The semiconductor material(s) may be selected from the candidate semiconductor materials of the substrate 50. The lower semiconductor layers 56L and the upper semiconductor layers 56U may be formed of the same semiconductor material, or may be formed of different semiconductor materials. In some embodiments, the lower semiconductor layers 56L and the upper semiconductor layers 56U are both be formed of a semiconductor material suitable for p-type devices and n-type devices, such as silicon. In some embodiments, the lower semiconductor layers 56L are formed of a semiconductor material suitable for p-type devices, such as germanium or silicon-germanium, and the upper semiconductor layers 56U are formed of a semiconductor material suitable for n-type devices, such as silicon or carbon-doped silicon. The semiconductor material(s) of the semiconductor layers 56 will be subsequently described in greater detail. The semiconductor material(s) of the semiconductor layers 56 have a high etching selectivity to the semiconductor materials of the dummy layers 54. As such, the materials of the dummy layers 54 may be removed at a faster rate than the material of the semiconductor layers 56 in subsequent processing.

Some layers of the multi-layer stack 52 may be thicker than other layers of the multi-layer stack 52. The thickness of the second dummy layer 54B may be different (e.g., greater or less) than the thickness of each of the first dummy layers 54A. In some embodiments, the second dummy layer 54B has a small thickness, such as a lesser thickness than each of the first dummy layers 54A. Forming the second dummy layer 54B to a small thickness may allow the second dummy layer 54B to be more easily removed in subsequently processing. In other embodiments, the second dummy layer 54B has a large thickness, such as a greater thickness than each of the first dummy layers 54A. Forming the second dummy layer 54B to a large thickness may increase the isolation between subsequently formed channel regions. In some embodiments, the thickness of the first dummy layers 54A is in the range of 3 nm to 10 nm, the thickness of the second dummy layer 54B is in the range of 1 nm to 4 nm, and the second dummy layer 54B is from 40% to 90% thinner than the first dummy layers 54A. The thickness of the second dummy layer 54B being less than 1 nm or greater than 4 nm may result in over-etching or under-etching, respectively, during removal of the second dummy layer 54B in subsequently processing. Additionally, the thickness of each of the semiconductor layers 56 may be different (e.g., greater or less) than the thickness(es) of each of the first dummy layers 54A and/or the second dummy layer 54B. In some embodiments, the second dummy layer 54B may be thicker than each of the semiconductor layers 56. In other embodiments, each of the semiconductor layers 56 may be thicker than each of the dummy layers 54.

In some embodiments, the first dummy layers 54A are formed of silicon-germanium, the second dummy layer 54B is formed of doped silicon, and the semiconductor layers 56 are formed of silicon. The silicon of the semiconductor layers 56 may be undoped or lightly doped at this step of processing. In some embodiments, the second dummy layer 54B is formed of silicon doped with an n-type impurity or with a p-type impurity. The n-type impurity may be phosphorus, arsenic, or the like. The p-type impurity may be boron or the like. Utilizing doped silicon for the second dummy layer 54B allows it to have a high etching selectivity to the first dummy layers 54A and the semiconductor layers 56. For example, the second dummy layer 54B may be at least partially replaced with an isolation structure. As part of the replacement process, the second dummy layer 54B may be removed with an etchant that is selective to the dopant of the second dummy layer 54B. Accordingly, the second dummy layer 54B may be removed at a faster rate than the first dummy layers 54A and the semiconductor layers 56. Utilizing doped silicon for the second dummy layer 54B may be advantageous over other semiconductor materials, such as silicon-germanium with a high germanium concentration, which has a low critical thickness and thus may have a high risk of defect generation when grown to a large thickness. Additionally, utilizing doped silicon for the second dummy layer 54B may reduce a lattice mismatch with the lower semiconductor layer 56L on which the second dummy layer 54B is grown. Accordingly, forming the second dummy layer 54B of doped silicon may allow it to be grown to a large thickness with a reduced risk of defect generation while still maintaining etch selectivity.

In FIG. 3, fins 62 are formed in the substrate 50 and nanostructures 64, 66 (including first dummy nanostructures 64A, second dummy nanostructures 64B, lower semiconductor nanostructures 66L, middle semiconductor nanostructures 66M, and upper semiconductor nanostructures 66U) are formed in the multi-layer stack 52. In some embodiments, the nanostructures 64, 66 and the fins 62 may be formed in the multi-layer stack 52 and the substrate 50, respectively, by etching trenches in the multi-layer stack 52 and the substrate 50. The etching may be any acceptable etch process, such as a reactive ion etch (RIE), neutral beam etch (NBE), the like, or a combination thereof. The etching may be anisotropic. Forming the nanostructures 64, 66 by etching the multi-layer stack 52 may define the first dummy nanostructures 64A from the first dummy layers 54A, the second dummy nanostructures 64B from the second dummy layer 54B, the lower semiconductor nanostructures 66L from some of the lower semiconductor layers 56L, the upper semiconductor nanostructures 66U from some of the upper semiconductor layers 56U, and the middle semiconductor nanostructures 66M from some of the lower semiconductor layers 56L and some of the upper semiconductor layers 56U. The first dummy nanostructures 64A and the second dummy nanostructures 64B may further be collectively referred to as the dummy nanostructures 64. The lower semiconductor nanostructures 66L and the upper semiconductor nanostructures 66U may further be collectively referred to as the semiconductor nanostructures 66.

As subsequently described in greater detail, various one of the nanostructures 64, 66 will be removed to form channel regions of CFETs. Specifically, the lower semiconductor nanostructures 66L will act as channel regions for lower nanostructure-FETs of the CFETs. Additionally, the upper semiconductor nanostructures 66U will act as channel regions for upper nanostructure-FETs of the CFETs.

The middle semiconductor nanostructures 66M are the semiconductor nanostructures 66 that are directly above/below (e.g., in contact with) the second dummy nanostructures 64B. Depending on the heights of subsequently formed source/drain regions, the middle semiconductor nanostructures 66M may or may not adjoin any source/drain regions and may or may not act as functional channel regions for the CFETs. The second dummy nanostructures 64B will be subsequently replaced with isolation structures. The isolation structures and the middle semiconductor nanostructures 66M may define boundaries of the lower nanostructure-FETs and the upper nanostructure-FETs.

The fins 62 and the nanostructures 64, 66 may be patterned by any suitable method. For example, the fins 62 and the nanostructures 64, 66 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 62 and the nanostructures 64, 66. In some embodiments, a mask (or other layer) may remain on the nanostructures 64, 66.

Although each of the fins 62 and the nanostructures 64, 66 are illustrated as having a constant width throughout, in other embodiments, the fins 62 and/or the nanostructures 64, 66 may have tapered sidewalls such that a width of each of the fins 62 and/or the nanostructures 64, 66 continuously increases in a direction towards the substrate 50. In such embodiments, each of the nanostructures 64, 66 may have a different width and be trapezoidal in shape.

Further, isolation regions 70 are formed over the substrate 50 and between adjacent semiconductor fins 62. The isolation regions 70 may include a liner and a fill material over the liner. Each of the liner and the fill material may include a dielectric material such as an oxide (e.g., silicon oxide), a nitride (e.g., silicon nitride), the like, or a combination thereof. The formation of the isolation regions 70 may include depositing the dielectric material(s), and performing a planarization process such as a chemical mechanical polish (CMP) process, a mechanical polishing process, or the like to remove excess portions of the dielectric material(s), such as portions over the nanostructures 64, 66. The deposition processes may include ALD, high-density plasma chemical vapor deposition (HDP-CVD), flowable chemical vapor deposition (FCVD), the like, or a combination thereof. In some embodiments, the isolation regions 70 include silicon oxide formed by an FCVD process, followed by an anneal process. Then, the dielectric material(s) are recessed to define the isolation regions 70. The dielectric material(s) maybe recessed such that upper portions of the semiconductor fins 62 and the nanostructures 64, 66 extend higher than the isolation regions 70.

The previously described process is just one example of how the fins 62 and the nanostructures 64, 66 may be formed. In some embodiments, the fins 62 and/or the nanostructures 64, 66 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 62 and/or the nanostructures 64, 66. The epitaxial structures may comprise the previously described alternating semiconductor materials, such as the first semiconductor material, the second semiconductor material, and the doped silicon of the second dummy nanostructures 64B. In some embodiments where epitaxial structures are epitaxially grown, the epitaxially grown materials may be in situ doped during growth, which may obviate prior and/or subsequent implantations, although in situ and implantation doping may be used together.

Further, appropriate wells (not separately illustrated) may be formed in the semiconductor nanostructures 66. For example, an n-type impurity implant and/or a p-type impurity implant may be performed, or the semiconductor materials may be in situ doped during growth. The n-type impurities may be phosphorus, arsenic, antimony, or the like at a concentration in a range from $10^{17}$ atoms/cm³ to $10^{19}$ atoms/cm³. The p-type impurities may be boron, boron fluoride, indium, or the like at a concentration in a range from $10^{17}$ atoms/cm³ to $10^{19}$ atoms/cm³. The wells in the lower semiconductor nanostructures 66L have a conductivity type opposite from a conductivity type of lower source/drain regions that will be subsequently formed adjacent the lower semiconductor nanostructures 66L. The wells in the upper semiconductor nanostructures 66U have a conductivity type opposite from a conductivity type of upper source/drain regions that will be subsequently formed adjacent the upper semiconductor nanostructures 66U.

When the semiconductor nanostructures 66 are doped, they may have a lesser dopant concentration than the first dummy nanostructures 64A. In some embodiments, the first dummy nanostructures 64A have a dopant concentration of greater than $10^{20}$ atoms/cm³, while the semiconductor nanostructures 66 have a dopant concentration in a range from $10^{17}$ atoms/cm³ to $10^{19}$ atoms/cm³. Therefore, a desired etching selectivity among the materials of the first dummy nanostructures 64A, the second dummy nanostructures 64B, and the semiconductor nanostructures 66 may still be achieved. Accordingly, and as subsequently described in greater detail, the first dummy nanostructures 64A may be removed at a faster rate than the second dummy nanostructures 64B and the semiconductor nanostructures 66.

In FIG. 4, a dummy dielectric layer 72 is formed on the fins 62 and/or the nanostructures 64, 66. The dummy dielectric layer 72 may be, for example, silicon oxide, silicon nitride, a combination thereof, or the like, and may be deposited or thermally grown according to acceptable techniques. A dummy gate layer 74 is formed over the dummy dielectric layer 72, and a mask layer 76 is formed over the dummy gate layer 74. The dummy gate layer 74 may be deposited over the dummy dielectric layer 72 and then planarized, such as by a CMP. The mask layer 76 may be deposited over the dummy gate layer 74. The dummy gate layer 74 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 74 may be deposited by physical vapor deposition (PVD), CVD, sputter deposition, or other techniques for depositing the selected material. The dummy gate layer 74 may be formed of other materials that have a high etching selectivity to insulating materials. The mask layer 76 may include, for example, silicon nitride, silicon oxynitride, or the like. In the illustrated embodiment, the dummy dielectric layer 72 covers the isolation regions 70, such that the dummy dielectric layer 72 extends between the dummy gate layer 74 and the isolation regions 70. In another embodiment, the dummy dielectric layer 72 covers only the fins 62 and/or the nanostructures 64, 66.

Figure 5:
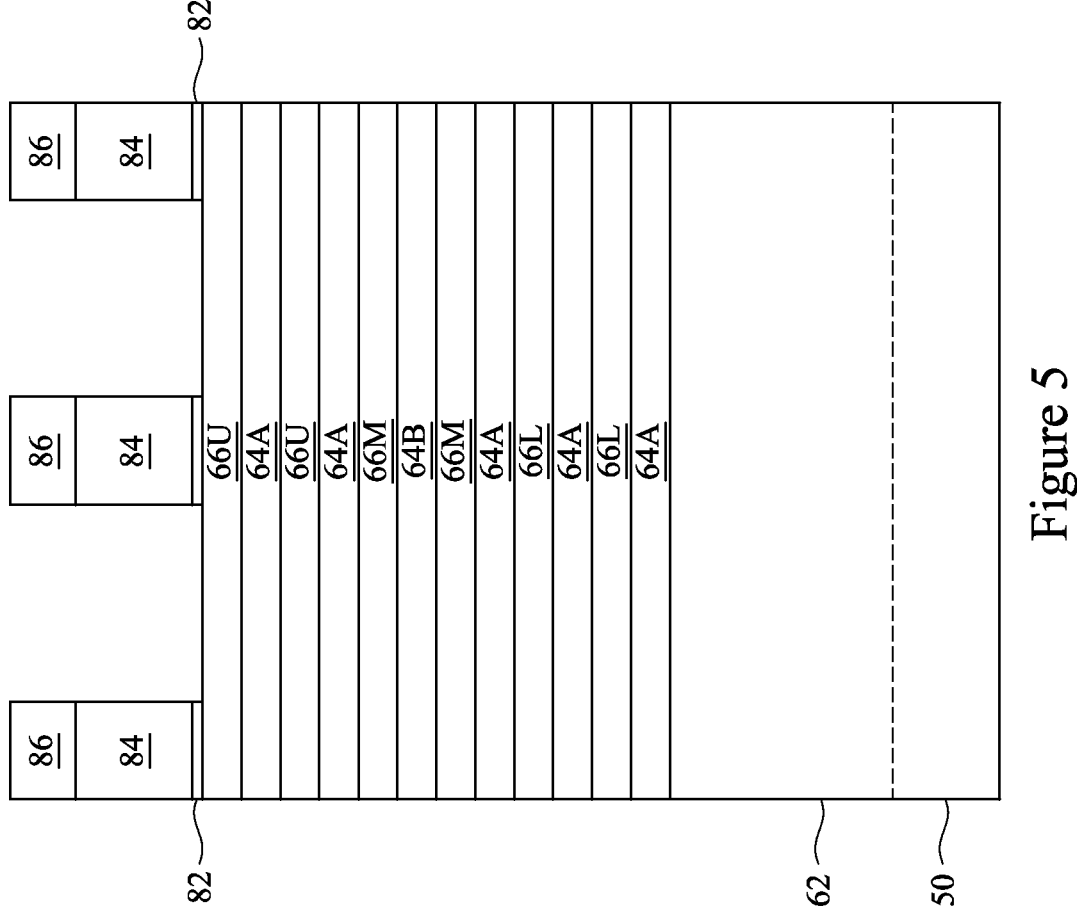

In FIG. 5, the mask layer 76 may be patterned using acceptable photolithography and etching techniques to form masks 86. The pattern of the masks 86 then may be transferred to the dummy gate layer 74 and to the dummy dielectric layer 72 to form dummy gates 84 and dummy dielectrics 82, respectively. The dummy gates 84 cover respective channel regions of the nanostructures 64, 66. The pattern of the masks 86 may be used to physically separate each of the dummy gates 84 from adjacent dummy gates 84. The dummy gates 84 may also have a lengthwise direction substantially perpendicular to the lengthwise direction of respective fins 62. The masks 86 can optionally be removed after patterning, such as by any acceptable etching technique.

Figure 6:
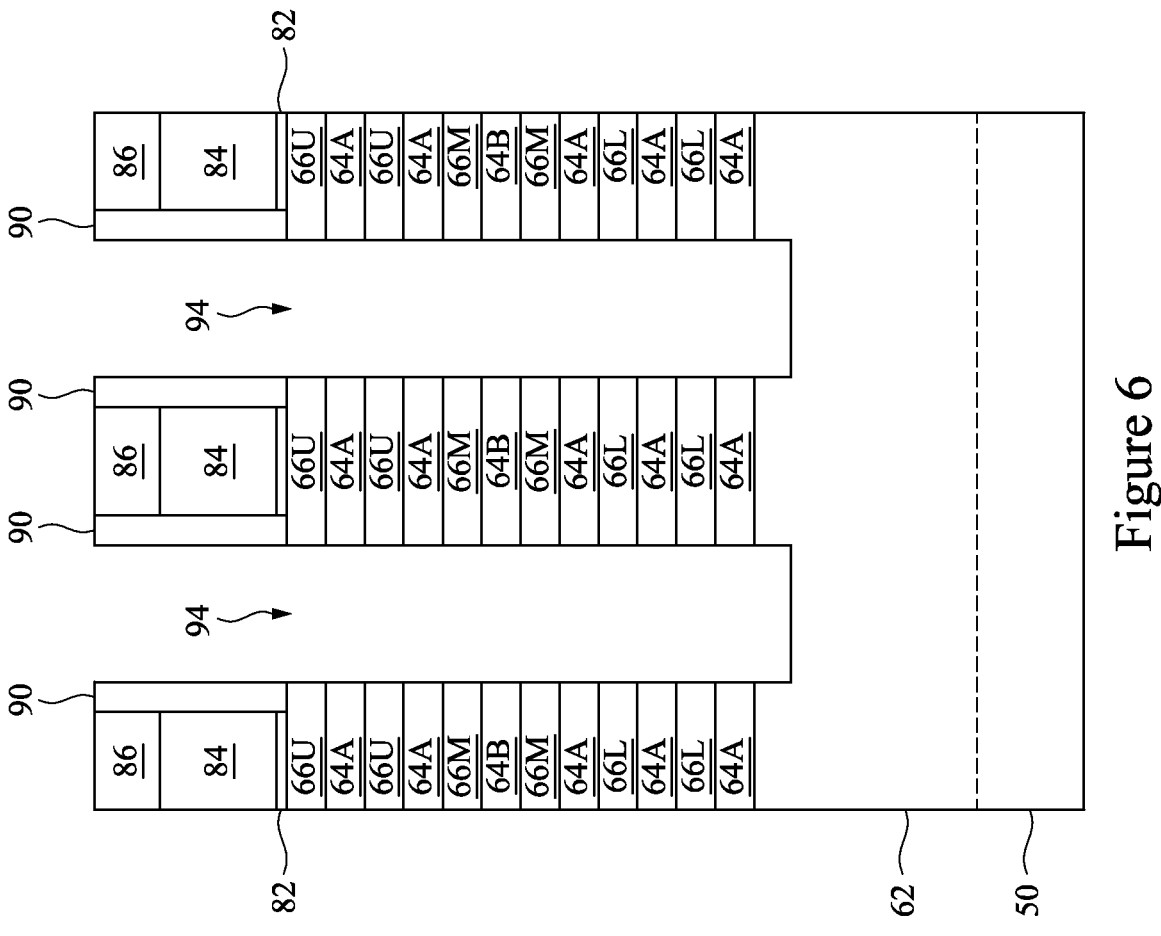

In FIG. 6, gate spacers 90 are formed over the nanostructures 64, 66 and on exposed sidewalls of the masks 86 (if present), the dummy gates 84, and the dummy dielectrics 82. The gate spacers 90 may be formed by conformally forming one or more dielectric material(s) and subsequently etching the dielectric material(s). Acceptable dielectric materials may include silicon oxide, silicon nitride, silicon oxynitride, silicon oxycarbonitride, or the like, which may be formed by a deposition process such as chemical vapor deposition (CVD), atomic layer deposition (ALD), or the like. Other dielectric materials formed by any acceptable process may be used. Any acceptable etch process, such as a dry etch, a wet etch, the like, or a combination thereof, may be performed to pattern the dielectric material(s). The etching may be anisotropic. The dielectric material(s), when etched, have portions left on the sidewalls of the dummy gates 84 (thus forming the gate spacers 90). In some embodiments, the dielectric material(s), when etched, may also have portions left on the sidewalls of the fins 62 and/or the nanostructures 64, 66.

Further, implants for lightly doped source/drain (LDD) regions (not separately illustrated) may be performed. The LDD implants may be performed before the gate spacers 90 are formed. Appropriate type impurities may be implanted into the nanostructures 64, 66 to a desired depth. The LDD regions may have a same conductivity type as a conductivity type of source/drain regions that will be subsequently formed adjacent the semiconductor nanostructures 66. Additionally, the LDD regions in the lower semiconductor nanostructures 66L may have a conductivity type opposite from a conductivity type of the LDD regions in the upper semiconductor nanostructures 66U. In some embodiments, the lower semiconductor nanostructures 66L have p-type LDD regions and the upper semiconductor nanostructures 66U have n-type LDD regions. In some embodiments, the lower semiconductor nanostructures 66L have n-type LDD regions and the upper semiconductor nanostructures 66U have p-type LDD regions. The n-type impurities may be the any of the n-type impurities previously discussed, and the p-type impurities may be the any of the p-type impurities previously discussed. The lightly doped source/drain regions may have a concentration of impurities in a range from $10^{17}$ atoms/cm³ to $10^{20}$ atoms/cm³. An anneal may be used to repair implant damage and to activate the implanted impurities. In some embodiments, the grown materials of the nanostructures 64, 66 may be in situ doped during growth, which may obviate the implantations, although in situ and implantation doping may be used together.

It is noted that the previous disclosure generally describes a process of forming spacers and LDD regions. Other processes and sequences may be used. For example, fewer or additional spacers may be utilized, different sequence of steps may be utilized, additional spacers may be formed and removed, and/or the like.

Source/drain recesses 94 are formed in the fins 62, the nanostructures 64, 66, and the substrate 50. Epitaxial source/drain regions will be subsequently formed in the source/drain recesses 94. The source/drain recesses 94 may extend through the nanostructures 64, 66 and into the substrate 50. The fins 62 may be etched such that bottom surfaces of the source/drain recesses 94 are disposed above, below, or level with the top surfaces of the isolation regions 70. In the illustrated example, the top surfaces of the isolation regions 70 are above the bottom surfaces of the source/drain recesses 94. The source/drain recesses 94 may be formed by etching the fins 62, the nanostructures 64, 66, and the substrate 50 using anisotropic etching processes, such as RIE, NBE, or the like. The gate spacers 90 and the dummy gates 84 mask portions of the fins 62, the nanostructures 64, 66, and the substrate 50 during the etching processes used to form the source/drain recesses 94. A single etch process or multiple etch processes may be used to etch each layer of the nanostructures 64, 66 and/or the fins 62. Timed etch processes may be used to stop the etching of the source/drain recesses 94 after the source/drain recesses 94 reach a desired depth.

Figure 7:
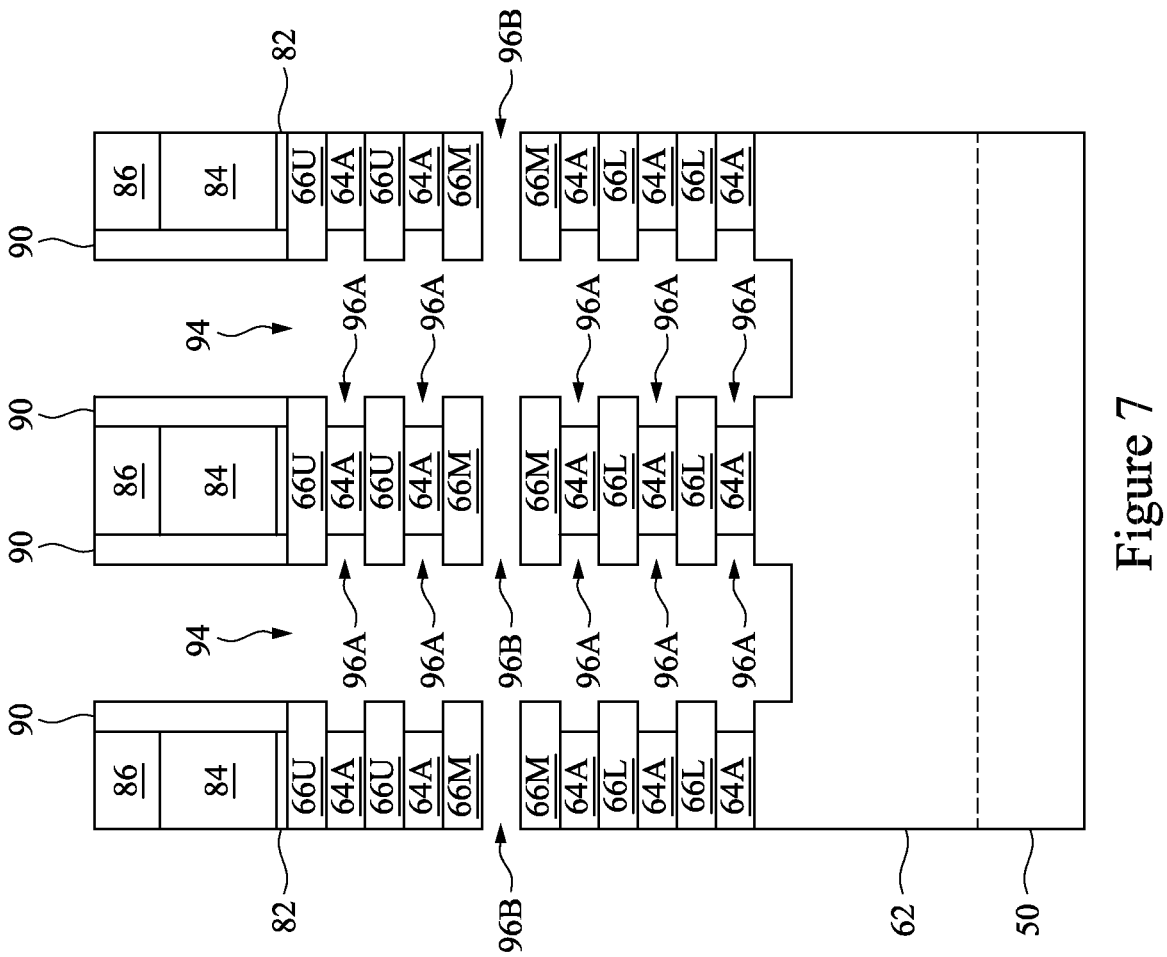

In FIG. 7, the sidewalls of the first dummy nanostructures 64A exposed by the source/drain recesses 94 are recessed to form sidewall recesses 96A. Additionally, the second dummy nanostructures 64B are removed to form openings 96B between the lower semiconductor nanostructures 66L (collectively) and the upper semiconductor nanostructures 66U (collectively). The sidewall recesses 96A will subsequently be filled with spacers. The openings 96B will subsequently be filled with isolation structures.

The sidewall recesses 96A may be formed by recessing the sidewalls of the first dummy nanostructures 64A with any acceptable etch process. The etching is selective to the first dummy nanostructures 64A (e.g., selectively etches the material of the first dummy nanostructures 64A at a faster rate than the material of the semiconductor nanostructures 66). The etching may be isotropic. Although sidewalls of the first dummy nanostructures 64A are illustrated as being straight after the etching, the sidewalls may be concave or convex.

The openings 96B may be formed by removing the second dummy nanostructures 64B with any acceptable etch process. The etching is selective to the second dummy nanostructures 64B (e.g., selectively etches the material of the second dummy nanostructures 64B at a faster rate than the material of the semiconductor nanostructures 66). The etching may be isotropic. The dummy gates 84 may adhere to and support the upper semiconductor nanostructures 66U so that the upper semiconductor nanostructures 66U do not collapse after the formation of the openings 96B.

In some embodiments, the same etching process is used to recess the sidewalls of the first dummy nanostructures 64A and to remove the second dummy nanostructures 64B. For example, the second dummy nanostructures 64B may be completely removed without completely removing the first dummy nanostructures 64A, and the first dummy nanostructures 64A may be recessed without significantly recessing the semiconductor nanostructures 66. The etching process has selectivity among the materials of the first dummy nanostructures 64A, the second dummy nanostructures 64B, and the semiconductor nanostructures 66. Specifically, the etching process selectively etches the material of the first dummy nanostructures 64A at a faster rate than the material of the semiconductor nanostructures 66, and also selectively etches the material of the second dummy nanostructures 64B at a faster rate than the selectively etches the material of the first dummy nanostructures 64A. Thus, the etch rate of the first dummy nanostructures 64A is less than the etch rate of the second dummy nanostructures 64B and is greater than the etch rate of the semiconductor nanostructures 66. In some embodiments where the first dummy nanostructures 64A are formed of silicon-germanium, the second dummy nanostructures 64B are formed of doped silicon with a high dopant concentration, and the semiconductor nanostructures 66 are formed of doped silicon with a low dopant concentration, the etch process is a dry etch using chlorine gas, with or without a plasma. The etch process etches the doped silicon with the high dopant concentration at a faster rate than the doped silicon with the low dopant concentration.

The middle semiconductor nanostructures 66M are exposed by the openings 96B. In some embodiments, the etching process thins the middle semiconductor nanostructures 66M. Accordingly, the thickness of the middle semiconductor nanostructures 66M may be different (e.g., less than) the thickness of the lower semiconductor nanostructures 66L and the thickness of the upper semiconductor nanostructures 66U. In some embodiments, the middle semiconductor nanostructures 66M are from 0% to 20% thinner than the lower semiconductor nanostructures 66L and the upper semiconductor nanostructures 66U after the etching process.

Figure 8:
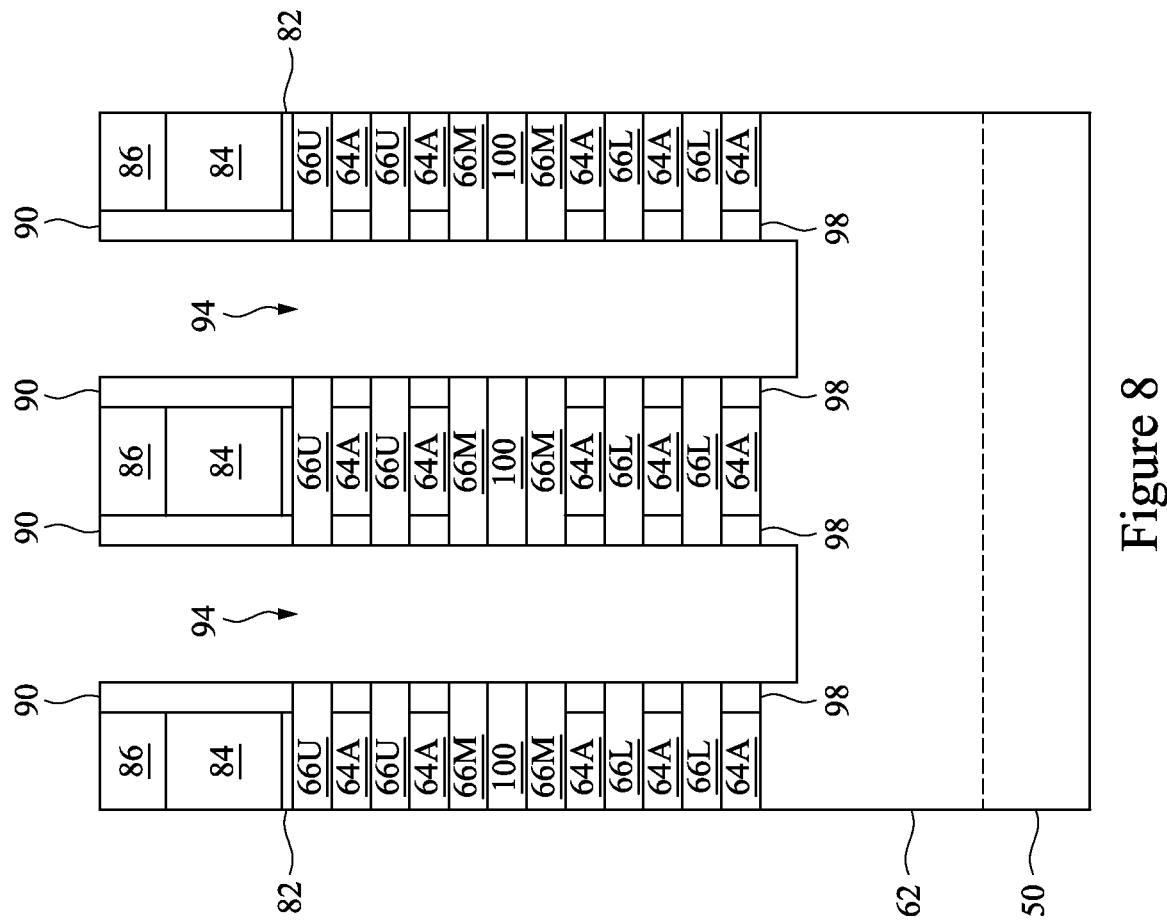

In FIG. 8, inner spacers 98 are formed in the sidewall recesses 96A and on the sidewalls of the remaining portions of the first dummy nanostructures 64A. As subsequently described in greater detail, source/drain regions will be subsequently formed in the source/drain recesses 94, and the first dummy nanostructures 64A will be replaced with corresponding gate structures. The inner spacers 98 act as isolation features between the subsequently formed source/drain regions and the subsequently formed gate structures. Further, the inner spacers 98 may be used to prevent damage to the subsequently formed source/drain regions by subsequent etch processes, such as etch processes used to form gate structures. Additionally, isolation structures 100 are formed in the openings 96B and between the middle semiconductor nanostructures 66M. The isolation structures 100 and the middle semiconductor nanostructures 66M will define the boundaries of the lower nanostructure-FETs and the upper nanostructure-FETs.

The inner spacers 98 and the isolation structures 100 may be formed by conformally forming an insulating material in the source/drain recesses 94, the sidewall recesses 96A, and the openings 96B, and then subsequently etching the insulating material. The insulating material may be a carbon-containing dielectric material, such as silicon oxycarbonitride, silicon oxycarbide, silicon oxynitride, or the like. Other low-dielectric constant (low-k) materials having a k-value less than about 3.5 may be utilized. The insulating material may be formed by a deposition process, such as ALD, CVD, or the like. The etching of the insulating material may be anisotropic. For example, the etch process may be a dry etch such as a RIE, a NBE, or the like. The insulating material, when etched, has portions remaining in the sidewall recesses 96A (thus forming the inner spacers 98) and has portions remaining in the openings 96B (thus forming the isolation structures 100).

Although outer sidewalls of the inner spacers 98 and the isolation structures 100 are illustrated as being flush with sidewalls of the semiconductor nanostructures 66, the outer sidewalls of the inner spacers 98 and the isolation structures 100 may extend beyond or be recessed from sidewalls of the semiconductor nanostructures 66. Thus, the inner spacers 98 and the isolation structures 100 may partially fill, completely fill, or overfill the sidewall recesses 96A and the openings 96B, respectively. Moreover, although the sidewalls of the inner spacers 98 and the isolation structures 100 are illustrated as being straight, those sidewalls may be concave or convex.

The isolation structures 100 have similar dimensions as the second dummy nanostructures 64B they replaced. Accordingly, the isolation structures 100 may have a large thickness, such as a greater thickness than the semiconductor nanostructures 66 and the first dummy nanostructures 64A, or the isolation structures 100 may have a small thickness, such as a lesser thickness than the semiconductor nanostructures 66 and the first dummy nanostructures 64A. In some embodiments, the isolation structures 100 are from 60% to 90% thinner than the semiconductor nanostructures 66 and the isolation structures 100 are from 40% to 90% thinner than the first dummy nanostructures 64A.

Figure 9:
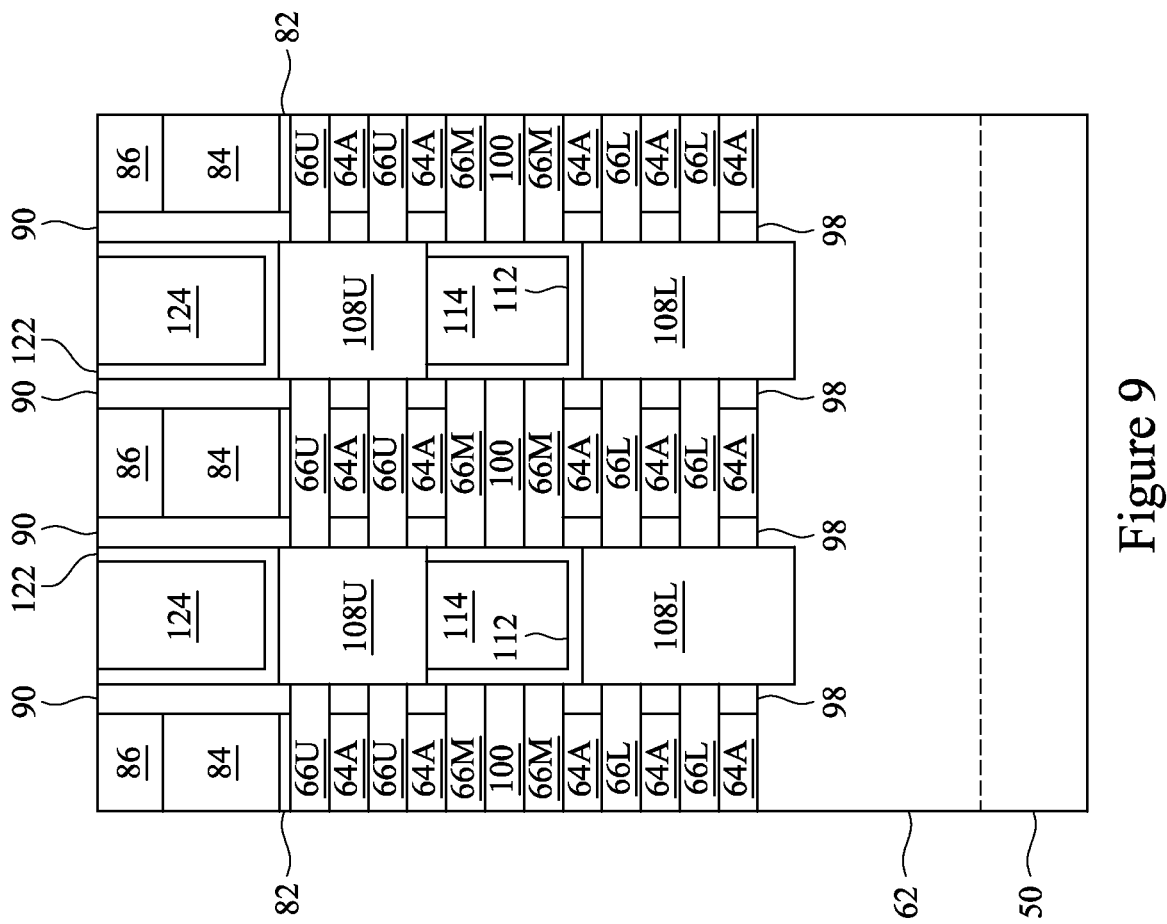

In FIG. 9, lower epitaxial source/drain regions 108L and upper epitaxial source/drain regions 108U are formed in the source/drain recesses 94. A first contact etch stop layer (CESL) 112 and/or a first inter-layer dielectric (ILD) 114 may also be formed in the source/drain recesses 94. The first ILD 114 is between the upper epitaxial source/drain regions 108U and the lower epitaxial source/drain regions 108L. The lower epitaxial source/drain regions 108L are for lower nanostructure-FETs of the CFETs, and the upper epitaxial source/drain regions 108U are for upper nanostructure-FETs of the CFETs. The first ILD 114 thus acts as isolation regions to prevent shorting of the lower and upper nanostructure-FETs. Additionally, a second CESL 122 and/or a second ILD 124 may be formed on the upper epitaxial source/drain regions 108U.

The lower epitaxial source/drain regions 108L are in contact with the lower semiconductor nanostructures 66L and are not in contact with the upper semiconductor nanostructures 66U. In some embodiments, the lower epitaxial source/drain regions 108L exert stress in the respective channel regions of the lower semiconductor nanostructures 66L, thereby improving performance. The lower epitaxial source/drain regions 108L are formed in the source/drain recesses 94 such that each stack of the lower semiconductor nanostructures 66L is disposed between respective neighboring pairs of the lower epitaxial source/drain regions 108L. In some embodiments, the inner spacers 98 are used to separate the lower epitaxial source/drain regions 108L from the first dummy nanostructures 64A, which will be replaced with gate structures in subsequent processes.

The lower epitaxial source/drain regions 108L are epitaxially grown in the lower portions of the source/drain recesses 94. For example, the lower epitaxial source/drain regions 108L may be grown laterally from exposed sidewalls of the lower semiconductor nanostructures 66L. During the epitaxy of the lower epitaxial source/drain regions 108L, the middle semiconductor nanostructures 66M and/or the upper semiconductor nanostructures 66U may be masked to prevent undesired epitaxial growth on the middle semiconductor nanostructures 66M and/or the upper semiconductor nanostructures 66U. After the lower epitaxial source/drain regions 108L are grown, the masks on the middle semiconductor nanostructures 66M and/or the upper semiconductor nanostructures 66U may then be removed. The lower epitaxial source/drain regions 108L have a conductivity type that is suitable for the device type of the lower nanostructure-FETs. In some embodiments, the lower epitaxial source/drain regions 108L are n-type source/drain regions. For example, if the lower semiconductor nanostructures 66L are silicon, the lower epitaxial source/drain regions 108L may include materials exerting a tensile strain on the lower semiconductor nanostructures 66L, such as silicon, carbon-doped silicon, phosphorous-doped silicon, silicon phosphide, silicon arsenide, or the like. In some embodiments, the lower epitaxial source/drain regions 108L are p-type source/drain regions. For example, if the lower semiconductor nanostructures 66L are silicon-germanium, the lower epitaxial source/drain regions 108L may include materials exerting a compressive strain on the lower semiconductor nanostructures 66L, such as silicon-germanium, boron-doped silicon-germanium, boron-doped silicon, germanium, germanium tin, or the like. The lower epitaxial source/drain regions 108L may have surfaces raised from respective upper surfaces of the lower semiconductor nanostructures 66L and may have facets.

The lower epitaxial source/drain regions 108L may be implanted with dopants to form source/drain regions, similar to the process previously discussed for forming lightly-doped source/drain regions, followed by an anneal. The source/drain regions may have an impurity concentration in the range of $10^{19}$ atoms/cm$^3$ and $10^{21}$ atoms/cm$^3$. The n-type and/or p-type impurities for source/drain regions may be any of the impurities previously discussed. In some embodiments, the lower epitaxial source/drain regions 108L are in situ doped during growth.

As a result of the epitaxy processes used to form the lower epitaxial source/drain regions 108L, upper surfaces of the lower epitaxial source/drain regions 108L have facets which expand laterally outward beyond sidewalls of the nanostructures 64, 66. In some embodiments, adjacent lower epitaxial source/drain regions 108L remain separated after the epitaxy process is completed. In other embodiments, these facets cause adjacent lower epitaxial source/drain regions 108L of a same nanostructure-FET to merge.

The first ILD 114 is formed over the lower epitaxial source/drain regions 108L. The first ILD 114 may be formed of a dielectric material, which may be deposited by any suitable method, such as CVD, plasma-enhanced chemical vapor deposition (PECVD), or FCVD. Dielectric materials may include phospho-silicate glass (PSG), boro-silicate glass (BSG), boron-doped phospho-silicate glass (BPSG), undoped silicate glass (USG), or the like. Other dielectric materials formed by any acceptable process may be used.

The first CESL 112 may be formed between the first ILD 114 and the lower epitaxial source/drain regions 108L. The first CESL 112 may be formed of a dielectric material having a high etching selectivity to the dielectric material of the first ILD 114, such as silicon nitride, silicon oxide, silicon oxynitride, or the like, which may be formed by any suitable deposition process, such as CVD, ALD, or the like.

The first CESL 112 and/or the first ILD 114 may be formed by depositing a material for the first CESL 112 and depositing a material for the first ILD 114, followed by an etch-back process. In some embodiments, the first ILD 114 is initially etched, leaving the first CESL 112 unetched. An anisotropic etching process is then performed to remove the portions of the first CESL 112 that are higher than the first ILD 114. After the recessing, the sidewalls of the upper semiconductor nanostructures 66U are exposed.

The upper epitaxial source/drain regions 108U are in contact with the upper semiconductor nanostructures 66U and are not in contact with the lower semiconductor nanostructures 66L. In some embodiments, the upper epitaxial source/drain regions 108U exert stress in the respective channel regions of the upper semiconductor nanostructures 66U, thereby improving performance. The upper epitaxial source/drain regions 108U are formed in the source/drain recesses 94 such that each stack of the upper semiconductor nanostructures 66U is disposed between respective neighboring pairs of the upper epitaxial source/drain regions 108U. In some embodiments, the inner spacers 98 are used to separate the upper epitaxial source/drain regions 108U from the first dummy nanostructures 64A, which will be replaced with gate structures in subsequent processes.

The upper epitaxial source/drain regions 108U are epitaxially grown in the upper portions of the source/drain recesses 94. For example, the upper epitaxial source/drain regions 108U may be grown laterally from exposed sidewalls of the upper semiconductor nanostructures 66U. The upper epitaxial source/drain regions 108U have a conductivity type that is suitable for the device type of the upper nanostructure-FETs. The conductivity type of the upper epitaxial source/drain regions 108U may be opposite the conductivity type of the lower epitaxial source/drain regions 108L. Put another way, the upper epitaxial source/drain regions 108U may be oppositely doped from the lower epitaxial source/drain regions 108L. In some embodiments, the upper epitaxial source/drain regions 108U are n-type source/drain regions. For example, if the upper semiconductor nanostructures 66U are silicon, the upper epitaxial source/drain regions 108U may include materials exerting a tensile strain on the upper semiconductor nanostructures 66U, such as silicon, carbon-doped silicon, phosphorous-doped silicon, silicon phosphide, silicon arsenide, or the like. In some embodiments, the upper epitaxial source/drain regions 108U are p-type source/drain regions. For example, if the upper semiconductor nanostructures 66U are silicon-germanium, the upper epitaxial source/drain regions 108U may include materials exerting a compressive strain on the upper semiconductor nanostructures 66U, such as silicon-germanium, boron-doped silicon-germanium, boron-doped silicon, germanium, germanium tin, or the like. The upper epitaxial source/drain regions 108U may have surfaces raised from respective upper surfaces of the upper semiconductor nanostructures 66U and may have facets.

The upper epitaxial source/drain regions 108U may be implanted with dopants to form source/drain regions, similar to the process previously discussed for forming lightly-doped source/drain regions, followed by an anneal. The source/drain regions may have an impurity concentration in the range of $10^{19}$ atoms/cm$^3$ and $10^{21}$ atoms/cm$^3$. The n-type and/or p-type impurities for source/drain regions may be any of the impurities previously discussed. In some embodiments, the upper epitaxial source/drain regions 108U are in situ doped during growth.

As a result of the epitaxy processes used to form the upper epitaxial source/drain regions 108U, upper surfaces of the upper epitaxial source/drain regions 108U have facets which expand laterally outward beyond sidewalls of the nanostructures 64, 66. In some embodiments, adjacent upper epitaxial source/drain regions 108U remain separated after the epitaxy process is completed. In other embodiments, these facets cause adjacent upper epitaxial source/drain regions 108U of a same nanostructure-FET to merge.

The second ILD 124 is deposited over the upper epitaxial source/drain regions 108U. The second ILD 124 may be formed of a dielectric material, which may be deposited by any suitable method, such as CVD, plasma-enhanced chemical vapor deposition (PECVD), or FCVD. Dielectric materials may include phospho-silicate glass (PSG), boro-silicate glass (BSG), boron-doped phospho-silicate glass (BPSG), undoped silicate glass (USG), or the like. Other dielectric materials formed by any acceptable process may be used.

The second CESL 122 may be formed between the second ILD 124 and the upper epitaxial source/drain regions 108U. The second CESL 122 may be formed of a dielectric material having a high etching selectivity to the dielectric material of the second ILD 124, such as, silicon nitride, silicon oxide, silicon oxynitride, or the like, which may be formed by any suitable deposition process, such as CVD, ALD, or the like.

The second CESL 122 and/or the second ILD 124 may be formed by depositing a material for the second CESL 122 and depositing a material for the second ILD 124. A removal process is then performed to level the top surfaces of the second ILD 124 with the top surfaces of the gate spacers 90 and the masks 86 (if present) or the dummy gates 84. In some embodiments, a planarization process such as a chemical mechanical polish (CMP), an etch-back process, combinations thereof, or the like may be utilized. The planarization process may also remove the masks 86 on the dummy gates 84, and portions of the gate spacers 90 along sidewalls of the masks 86. After the planarization process, top surfaces of the second ILD 124, the gate spacers 90, and the masks 86 (if present) or the dummy gates 84 are substantially coplanar (within process variations). Accordingly, the top surfaces of the masks 86 (if present) or the dummy gates 84 are exposed through the second ILD 124. In the illustrated embodiment, the masks 86 remain after the removal process. In other embodiments, the masks 86 are removed such that the top surfaces of the dummy gates 84 are exposed through the second ILD 124.

In FIG. 10, the dummy gates 84 are removed in one or more etching steps, so that recesses are formed between the gate spacers 90. Portions of the dummy dielectrics 82 in the recesses are also removed. In some embodiments, the dummy gates 84 and the dummy dielectrics 82 are removed by an anisotropic dry etch process. For example, the etching process may include a dry etch process using reaction gas(es) that selectively etch the material of the dummy gates 84 at a faster rate than the materials of the second ILD 124, the isolation structures 100, the inner spacers 98, and the gate spacers 90. Each recess between the gate spacers 90 exposes and/or overlies portions of nanostructures 64, 66 which act as the channel regions in the resulting devices. The portions of the nanostructures 64, 66 which act as the channel regions are disposed between neighboring pairs of the lower epitaxial source/drain regions 108L or between neighboring pairs of the upper epitaxial source/drain regions 108U. During the removal, the dummy dielectrics 82 may be used as etch stop layers when the dummy gates 84 are etched. The dummy dielectrics 82 may then be removed after the removal of the dummy gates 84.

The remaining portions of the first dummy nanostructures 64A are then removed to form openings in regions between the semiconductor nanostructures 66. The remaining portions of the first dummy nanostructures 64A can be removed by any acceptable etch process that selectively etches the material of the first dummy nanostructures 64A at a faster rate than the materials of the semiconductor nanostructures 66, the inner spacers 98, and the isolation structures 100. The etching may be isotropic. For example, when the first dummy nanostructures 64A are formed of silicon-germanium, the semiconductor nanostructures 66 are formed of silicon, the inner spacers 98 are formed of silicon oxycarbonitride, and the isolation structures 100 are formed of silicon oxycarbonitride, the etch process may be a wet etch using tetramethylammonium hydroxide (TMAH), ammonium hydroxide (NH$_4$OH), or the like. In some embodiments, a trim process (not separately illustrated) is performed to decrease the thicknesses of the exposed portions of the semiconductor nanostructures 66 and expand the openings between the semiconductor nanostructures 66.

Next, gate dielectrics 132 and gate electrodes 134 (including lower gate electrodes 134L and upper gate electrodes 134U) are formed for replacement gates. Each respective pair of a gate dielectric 132 and a gate electrode 134 (including an upper gate electrode 134U and/or a lower gate electrode 134L) may be collectively referred to as a "gate structure." Each gate structure extends along at least three sides (e.g., a top surface, a sidewall, and a bottom surface) of a channel region of a semiconductor nanostructure 66. The gate structures may also extend along sidewalls and/or a top surface of a semiconductor fin 62.

The gate dielectrics 132 include one or more gate dielectric layer(s) disposed around the lower semiconductor nanostructures 66L, the upper semiconductor nanostructures 66U, and the isolation structures 100. Specifically, the gate dielectrics 132 are disposed on the top surfaces of the fins 62; on the top surfaces, the sidewalls, and the bottom surfaces of the semiconductor nanostructures 66; and on the sidewalls of the gate spacers 90. The gate dielectrics 132 wrap around all (e.g., four) sides of the semiconductor nanostructures 66. The gate dielectrics 132 may be formed of an oxide such as silicon oxide or a metal oxide, a silicate such as a metal silicate, combinations thereof, multi-layers thereof, or the like. Additionally or alternatively, the gate dielectrics 132 may be formed of a high-k dielectric material (e.g., dielectric materials having a k-value greater than about 7.0), such as a metal oxide or a silicate of hafnium, aluminum, zirconium, lanthanum, manganese, barium, titanium, lead, and combinations thereof. The dielectric material(s) of the gate dielectrics 132 may be formed by molecular-beam deposition (MBD), ALD, PECVD, or the like. Although single-layered gate dielectrics 132 are illustrated, the gate dielectrics 132 may include any number of interfacial layers and any number of main layers. For example, the gate dielectrics 132 may include an interfacial layer and an overlying high-k dielectric layer.

The lower gate electrodes 134L include one or more gate electrode layer(s) disposed over the gate dielectrics 132 and around the lower semiconductor nanostructures 66L. The lower gate electrodes 134L are disposed in the lower portions of the recesses between the gate spacers 90 and in the openings between the lower semiconductor nanostructures 66L. The lower gate electrodes 134L may be formed of a metal-containing material such as tungsten, titanium, titanium nitride, tantalum, tantalum nitride, tantalum carbide, aluminum, ruthenium, cobalt, combinations thereof, multi-layers thereof, or the like. Although single-layered gate electrodes 134 are illustrated, the lower gate electrodes 134L may include any number of work function tuning layers, any number of barrier layers, any number of glue layers, and a fill material.

The lower gate electrodes 134L are formed of material(s) that are suitable for the device type of the lower nanostructure-FETs. For example, the lower gate electrodes 134L may include one or more work function tuning layer(s) formed of work function tuning metal(s) that are suitable for the device type of the lower nanostructure-FETs. In some embodiments, the lower gate electrodes 134L include an n-type work function tuning layer, which may be formed of an n-type work function tuning metal such as titanium aluminum, titanium aluminum carbide, tantalum aluminum, tantalum carbide, combinations thereof, or the like. In some embodiments, the lower gate electrodes 134L include a p-type work function tuning layer, which may be formed of a p-type work function tuning metal such as titanium nitride, tantalum nitride, combinations thereof, or the like. Additionally or alternatively, the lower gate electrodes 134L may include a dipole-inducing element that is suitable for the device type of the lower nanostructure-FETs. Acceptable dipole-inducing elements include lanthanum, aluminum, scandium, ruthenium, zirconium, erbium, magnesium, strontium, and combinations thereof.

The upper gate electrodes 134U include one or more gate electrode layer(s) disposed over the gate dielectrics 132 and around the upper semiconductor nanostructures 66U. The upper gate electrodes 134U are disposed in the upper portions of the recesses between the gate spacers 90 and in the openings between the upper semiconductor nanostructures 66U. The upper gate electrodes 134U may be formed of a metal-containing material such as tungsten, titanium, titanium nitride, tantalum, tantalum nitride, tantalum carbide, aluminum, ruthenium, cobalt, combinations thereof, multi-layers thereof, or the like. Although single-layered gate electrodes 134 are illustrated, the upper gate electrodes 134U may include any number of work function tuning layers, any number of barrier layers, any number of glue layers, and a fill material.

The upper gate electrodes 134U are formed of material(s) that are suitable for the device type of the upper nanostructure-FETs. For example, the upper gate electrodes 134U may include one or more work function tuning layer(s) formed of work function tuning metal(s) that are suitable for the device type of the upper nanostructure-FETs. In some embodiments, the upper gate electrodes 134U include an n-type work function tuning layer, which may be formed of an n-type work function tuning metal such as titanium aluminum, titanium aluminum carbide, tantalum aluminum, tantalum carbide, combinations thereof, or the like. In some embodiments, the upper gate electrodes 134U include a p-type work function tuning layer, which may be formed of a p-type work function tuning metal such as titanium nitride, tantalum nitride, combinations thereof, or the like. The work function tuning metal(s) of the upper gate electrodes 134U may be different than the work function tuning metal(s) of the lower gate electrodes 134L. Additionally or alternatively, the upper gate electrodes 134U may include a dipole-inducing element that is suitable for the device type of the upper nanostructure-FETs. Acceptable dipole-inducing elements include lanthanum, aluminum, scandium, ruthenium, zirconium, erbium, magnesium, strontium, and combinations thereof. The dipole-inducing elements the upper gate electrodes 134U may be different than the dipole-inducing elements of the lower gate electrodes 134L.

In some embodiments, isolation layers (not separately illustrated) are formed between the lower gate electrodes 134L and the upper gate electrodes 134U. The isolation layers act as isolation features between the lower gate electrodes 134L and the upper gate electrodes 134U. The isolation layers may be formed of a dielectric material. Acceptable dielectric materials may include silicon oxide, silicon nitride, silicon oxynitride, silicon oxycarbonitride, combinations thereof, or the like, which may be formed by a deposition process such as chemical vapor deposition (CVD), atomic layer deposition (ALD), or the like. Other dielectric materials formed by any acceptable process may be used. In embodiments where the isolation layers are formed, the isolation layers and the isolation structures 100 together isolate the upper gate electrodes 134U from the lower gate electrodes 134L. Accordingly, an upper nanostructure-FET may be isolated from a lower nanostructure-FET by a combination of an isolation structure 100 and an isolation layer. In some embodiments where the isolation layers are omitted, an upper nanostructure-FET may be coupled to a lower nanostructure-FET. When the isolation layers are omitted, the lower gate electrodes 134L may be physically and electrically coupled to the upper gate electrodes 134U.

As an example to form the gate structures, one or more gate dielectric layer(s) may be deposited in the recesses between the gate spacers 90 and the openings between the semiconductor nanostructures 66. The gate dielectric layer(s) may also be deposited on the top surfaces of the second ILD 124 and the gate spacers 90. Subsequently, one or more lower gate electrode layer(s) may be deposited on the gate dielectric layer(s), and in the remaining portions of the recesses between the gate spacers 90 and the openings between the semiconductor nanostructures 66. The lower gate electrode layer(s) may then be recessed. Any acceptable etch process, such as a dry etch, a wet etch, the like, or a combination thereof, may be performed to recess the lower gate electrode layer(s). The etching may be isotropic, such as an etch-back process that removes the lower gate electrode layer(s) from the upper portions of the recesses between the gate spacers 90, such that the lower gate electrode layer(s) remain in the openings between the lower semiconductor nanostructures 66L. In embodiments where the isolation layers are formed, an isolation material is conformally formed on the lower gate electrode layer(s) and then recessed. Any acceptable etch process, such as a dry etch, a wet etch, the like, or a combination thereof, may be performed to recess the isolation material. Subsequently, one or more upper gate electrode layer(s) may be deposited on the isolation material (if present) or the lower gate electrode layer(s), and in the remaining portions of the recesses between the gate spacers 90 and the openings between the upper semiconductor nanostructures 66U. A removal process is performed to remove the excess portions of the upper gate electrode layer(s), which excess portions are over the top surfaces of the gate spacers 90 and the second ILD 124, such that the upper gate electrode layer(s) remain in the openings between the upper semiconductor nanostructures 66U. In some embodiments, a planarization process such as a chemical mechanical polish (CMP), an etch-back process, combinations thereof, or the like may be utilized. The gate dielectric layer(s), after the removal process, have portions remaining in the recesses between the gate spacers 90 and the openings between the semiconductor nanostructures 66 (thus forming the gate dielectrics 132). The lower gate electrode layer(s), after the removal process, have portions left in the lower portions of the recesses between the gate spacers 90 and in the openings between the lower semiconductor nanostructures 66L (thus forming the lower gate electrodes 134L). The upper gate electrode layer(s), after the removal process, have portions left in the upper portions of the recesses between the gate spacers 90 and in the openings between the upper semiconductor nanostructures 66U (thus forming the upper gate electrodes 134U). When a planarization process is utilized, the top surfaces of the gate spacers 90, the second ILD 124, the gate dielectrics 132, and the upper gate electrodes 134U are coplanar (within process variations).

In FIG. 11, source/drain contacts 144 are formed through the second ILD 124 to electrically couple to the upper epitaxial source/drain regions 108U and/or the lower epitaxial source/drain regions 108L. As an example to form the source/drain contacts 144, openings for the source/drain contacts 144 are formed through the second ILD 124 and the second CESL 122. The openings may be formed using acceptable photolithography and etching techniques. In the illustrated embodiment, the openings are formed by a self-aligned contact (SAC) process. A liner (not separately illustrated), such as a diffusion barrier layer, an adhesion layer, or the like, and a conductive material are formed in the openings. The liner may include titanium, titanium nitride, tantalum, tantalum nitride, or the like. The conductive material may be cobalt, tungsten, copper, a copper alloy, silver, gold, aluminum, nickel, or the like. A removal process may be performed to remove excess material from the top surfaces of the gate spacers 90, the second ILD 124 (see FIG. 10), and the upper gate electrodes 134U. The remaining liner and conductive material form the source/drain contacts 144 in the openings. In some embodiments, a planarization process such as a chemical mechanical polish (CMP), an etch-back process, combinations thereof, or the like is utilized. After the planarization process, the top surfaces of the gate spacers 90, the second ILD 124 (see FIG. 10), the upper gate electrodes 134U, and the source/drain contacts 144 are substantially coplanar (within process variations).

Optionally, metal-semiconductor alloy regions 142 are formed at the interfaces between the source/drain regions 108 and the source/drain contacts 144. The metal-semiconductor alloy regions 142 can be silicide regions formed of a metal silicide (e.g., titanium silicide, cobalt silicide, nickel silicide, etc.), germanide regions formed of a metal germanide (e.g. titanium germanide, cobalt germanide, nickel germanide, etc.), silicon-germanide regions formed of both a metal silicide and a metal germanide, or the like. The metal-semiconductor alloy regions 142 can be formed before the material(s) of the source/drain contacts 144 by depositing a metal in the openings for the source/drain contacts 144 and then performing a thermal anneal process. The metal can be any metal capable of reacting with the semiconductor materials (e.g., silicon, silicon-germanium, germanium, etc.) of the source/drain regions 108 to form a low-resistance metal-semiconductor alloy, such as nickel, cobalt, titanium, tantalum, platinum, tungsten, other noble metals, other refractory metals, rare earth metals or their alloys. The metal can be deposited by a deposition process such as ALD, CVD, PVD, or the like. After the thermal anneal process, a cleaning process, such as a wet clean, may be performed to remove any residual metal from the openings for the source/drain contacts 144, such as from surfaces of the metal-semiconductor alloy regions 142. The material(s) of the source/drain contacts 144 can then be formed on the metal-semiconductor alloy regions 142.

In FIGS. 12A-12B, a third ILD 154 is deposited over the gate spacers 90, the second ILD 124, the upper gate electrodes 134U, and the source/drain contacts 144. In some embodiments, the third ILD 154 is a flowable film formed by a flowable CVD method, which is subsequently cured. In some embodiments, the third ILD 154 is formed of a dielectric material such as PSG, BSG, BPSG, USG, or the like, which may be deposited by any suitable method, such as CVD, PECVD, or the like.

In some embodiments, an etch stop layer (ESL) 152 is formed between the third ILD 154 and the gate spacers 90, the second ILD 124, the upper gate electrodes 134U, and the source/drain contacts 144. The ESL 152 may include a dielectric material having a high etching selectivity to the dielectric material of the third ILD 154, such as, silicon nitride, silicon oxide, silicon oxynitride, or the like.

Gate contacts 156 and source/drain vias 158 are formed through the third ILD 154 to electrically couple to, respectively, the upper gate electrodes 134U and the source/drain contacts 144. As an example to form the gate contacts 156 and the source/drain vias 158, openings for the gate contacts 156 and the source/drain vias 158 are formed through the third ILD 154 and the ESL 152. The openings may be formed using acceptable photolithography and etching techniques. A liner (not separately illustrated), such as a diffusion barrier layer, an adhesion layer, or the like, and a conductive material are formed in the openings. The liner may include titanium, titanium nitride, tantalum, tantalum nitride, or the like. The conductive material may be cobalt, tungsten, copper, a copper alloy, silver, gold, aluminum, nickel, or the like. A planarization process, such as a CMP, may be performed to remove excess material from the top surface of the third ILD 154. The remaining liner and conductive material form the gate contacts 156 and the source/drain vias 158 in the openings. The gate contacts 156 and the source/drain vias 158 may be formed in distinct processes, or may be formed in the same process. Although shown as being formed in the same cross-section, it should be appreciated that each of the gate contacts 156 and the source/drain vias 158 may be formed in different cross-sections, which may avoid shorting of the contacts.

The active devices as illustrated are collectively referred to as a device layer. In some embodiments, contacts to the lower gate electrodes 134L and the lower epitaxial source/drain regions 108L may be made through a backside of the device layer (e.g., a side opposite to the source/drain contacts 144).

Embodiments may achieve advantages. The isolation structures 100 help isolate the upper gate electrodes 134U from the lower gate electrodes 134L. Forming the isolation structures 100 by growing the second dummy nanostructures 64B and then at least partially replacing the second dummy nanostructures 64B with the isolation structures 100 allows isolation to be achieve between semiconductor nanostructures. Forming the second dummy nanostructures 64B of doped silicon may advantageously reduce the risk of generating defects in the multi-layer stack 52 during epitaxial growth.

In an embodiment, a method includes: patterning a lower semiconductor nanostructure, an upper semiconductor nanostructure, and a dummy nanostructure, the dummy nanostructure disposed between the lower semiconductor nanostructure and the upper semiconductor nanostructure, the dummy nanostructure including doped silicon; forming an opening between the lower semiconductor nanostructure and the upper semiconductor nanostructure by etching the doped silicon of the dummy nanostructure; forming an isolation structure in the opening; and depositing a gate dielectric around the isolation structure, the upper semiconductor nanostructure, and the lower semiconductor nanostructure. In some embodiments, the method further includes: forming a lower gate electrode on the gate dielectric and around the lower semiconductor nanostructure; and forming an upper gate electrode on the gate dielectric and around the upper semiconductor nanostructure. In some embodiments of the method, the lower gate electrode includes a p-type work function tuning layer and the upper gate electrode includes an n-type work function tuning layer. In some embodiments, the method further includes: forming a lower inner spacer and an upper inner spacer adjacent, respectively, the lower semiconductor nanostructure and the upper semiconductor nanostructure; growing a lower source/drain region adjacent the lower inner spacer; and growing an upper source/drain region adjacent the upper inner spacer. In some embodiments of the method, a conductivity type of the upper source/drain region is opposite a conductivity type of the lower source/drain region. In some embodiments of the method, the lower inner spacer, the upper inner spacer, and the isolation structure are formed of a same dielectric material. In some embodiments of the method, the doped silicon of the dummy nanostructure is etched with a dry etch using chlorine gas. In some embodiments of the method, the dummy nanostructure has a first thickness, each of the lower semiconductor nanostructure and the upper semiconductor nanostructure have a second thickness, and the first thickness is greater than the second thickness. In some embodiments of the method, the dummy nanostructure has a first thickness, each of the lower semiconductor nanostructure and the upper semiconductor nanostructure have a second thickness, and the first thickness is less than the second thickness.

In an embodiment, a method includes: patterning a first dummy nanostructure, a second dummy nanostructure, and a semiconductor nanostructure, the first dummy nanostructure including a first semiconductor material, the second dummy nanostructure including a second semiconductor material, the semiconductor nanostructure including a third semiconductor material, the third semiconductor material having a lesser dopant concentration than the second semiconductor material; recessing a sidewall of the first dummy nanostructure to form a sidewall recess; removing the second dummy nanostructure to form an opening, where the sidewall of the first dummy nanostructure is recessed and the second dummy nanostructure is removed with a same etching process, the same etching process selectively etching the second semiconductor material at a faster rate than the first semiconductor material, the same etching process selectively etching the first semiconductor material at a faster rate than the third semiconductor material; and forming an inner spacer and an isolation structure in, respectively, the sidewall recess and the opening. In some embodiments of the method, the first semiconductor material is silicon-germanium, the second semiconductor material is doped silicon, and the third semiconductor material is doped silicon. In some embodiments of the method, the same etching process includes a dry etch using chlorine gas. In some embodiments of the method, the second semiconductor material is doped with an n-type dopant. In some embodiments of the method, the second semiconductor material is doped with a p-type dopant. In some embodiments of the method, the second dummy nanostructure has a greater thickness than the first dummy nanostructure. In some embodiments of the method, the second dummy nanostructure has a lesser thickness than the first dummy nanostructure.

In an embodiment, a method includes: patterning a first semiconductor nanostructure, a second semiconductor nanostructure, and a dummy nanostructure, the dummy nanostructure disposed between the first semiconductor nanostructure and the second semiconductor nanostructure, the dummy nanostructure including silicon doped to a first dopant concentration, the first semiconductor nanostructure and the second semiconductor nanostructure each including silicon doped to a second dopant concentration, the first dopant concentration greater than the second dopant concentration; forming an opening by etching the dummy nanostructure with an etching process, the etching process selectively etching the silicon doped to the first dopant concentration at a faster rate than the silicon doped to the second dopant concentration; and forming an isolation structure in the opening. In some embodiments, the method further includes: growing a first source/drain region adjacent the first semiconductor nanostructure; depositing an inter-layer dielectric on the first source/drain region; and growing a second source/drain region on the inter-layer dielectric and adjacent the second semiconductor nanostructure. In some embodiments, the method further includes: forming a first gate electrode around the first semiconductor nanostructure; and forming a second gate electrode around the second semiconductor nanostructure. In some embodiments of the method, the etching process includes a dry etch using chlorine gas.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
patterning a lower semiconductor nanostructure, an upper semiconductor nanostructure, and a dummy nanostructure, the dummy nanostructure disposed between the lower semiconductor nanostructure and the upper semiconductor nanostructure, the dummy nanostructure comprising doped silicon;
forming an opening between the lower semiconductor nanostructure and the upper semiconductor nanostructure by etching the doped silicon of the dummy nanostructure;
forming an isolation structure in the opening; and
depositing a gate dielectric around the isolation structure, the upper semiconductor nanostructure, and the lower semiconductor nanostructure, wherein the gate dielectric extends continuously along a first sidewall of the isolation structure, a top surface of the upper semiconductor nanostructure, a second sidewall of the isolation structure, and a bottom surface of the lower semiconductor nanostructure, the first sidewall of the isolation structure being opposite the second sidewall of the isolation structure.

2. The method of claim 1, further comprising:
forming a lower gate electrode on the gate dielectric and around the lower semiconductor nanostructure; and
forming an upper gate electrode on the gate dielectric and around the upper semiconductor nanostructure.

3. The method of claim 2, wherein the lower gate electrode comprises a p-type work function tuning layer and the upper gate electrode comprises an n-type work function tuning layer.

4. The method of claim 1, further comprising:
forming a lower inner spacer and an upper inner spacer adjacent, respectively, the lower semiconductor nanostructure and the upper semiconductor nanostructure;

growing a lower source/drain region adjacent the lower inner spacer; and
growing an upper source/drain region adjacent the upper inner spacer.

5. The method of claim 4, wherein a conductivity type of the upper source/drain region is opposite a conductivity type of the lower source/drain region.

6. The method of claim 4, wherein the lower inner spacer, the upper inner spacer, and the isolation structure are formed of a same dielectric material.

7. The method of claim 1, wherein the doped silicon of the dummy nanostructure is etched with a dry etch using chlorine gas.

8. The method of claim 1, wherein the dummy nanostructure has a first thickness, each of the lower semiconductor nanostructure and the upper semiconductor nanostructure have a second thickness, and the first thickness is greater than the second thickness.

9. The method of claim 1, wherein the dummy nanostructure has a first thickness, each of the lower semiconductor nanostructure and the upper semiconductor nanostructure have a second thickness, and the first thickness is less than the second thickness.

10. A method comprising:
patterning a first dummy nanostructure, a second dummy nanostructure, and a semiconductor nanostructure, the first dummy nanostructure comprising a first semiconductor material, the second dummy nanostructure comprising a second semiconductor material, the semiconductor nanostructure comprising a third semiconductor material, the third semiconductor material having a lesser dopant concentration than the second semiconductor material;
recessing a sidewall of the first dummy nanostructure to form a sidewall recess;
removing the second dummy nanostructure to form an opening, wherein the sidewall of the first dummy nanostructure is recessed and the second dummy nanostructure is removed with a same etching process, the same etching process selectively etching the second semiconductor material at a faster rate than the first semiconductor material, the same etching process selectively etching the first semiconductor material at a faster rate than the third semiconductor material; and
forming an inner spacer and an isolation structure in, respectively, the sidewall recess and the opening, wherein the inner spacer and the first dummy nanostructure physically contact a bottom surface of the semiconductor nanostructure, and the isolation structure physically contacts a top surface of the semiconductor nanostructure which is opposite the bottom surface of the semiconductor nanostructure.

11. The method of claim 10, wherein the first semiconductor material is silicon-germanium, the second semiconductor material is doped silicon, and the third semiconductor material is doped silicon.

12. The method of claim 11, wherein the same etching process comprises a dry etch using chlorine gas.

13. The method of claim 11, wherein the second semiconductor material is doped with an n-type dopant.

14. The method of claim 11, wherein the second semiconductor material is doped with a p-type dopant.

15. The method of claim 10, wherein the second dummy nanostructure has a greater thickness than the first dummy nanostructure.

16. The method of claim 10, wherein the second dummy nanostructure has a lesser thickness than the first dummy nanostructure.

17. A method comprising:

patterning a first semiconductor nanostructure, a second semiconductor nanostructure, and a dummy nanostructure, the dummy nanostructure disposed between the first semiconductor nanostructure and the second semiconductor nanostructure, the dummy nanostructure comprising silicon doped to a first dopant concentration, the first semiconductor nanostructure and the second semiconductor nanostructure each comprising silicon doped to a second dopant concentration, the first dopant concentration greater than the second dopant concentration;

forming an opening by etching the dummy nanostructure with an etching process, the etching process selectively etching the silicon doped to the first dopant concentration at a faster rate than the silicon doped to the second dopant concentration;

forming an isolation structure in the opening;

forming a first gate electrode around the first semiconductor nanostructure; and forming a second gate electrode around the second semiconductor nanostructure, the second gate electrode physically contacting the first gate electrode.

18. The method of claim 17, further comprising:

growing a first source/drain region adjacent the first semiconductor nanostructure;

depositing an inter-layer dielectric on the first source/drain region; and growing a second source/drain region on the inter-layer dielectric and adjacent the second semiconductor nanostructure.

19. The method of claim 17, wherein the etching process comprises a dry etch using chlorine gas.

20. The method of claim 17, further comprising:

depositing a gate dielectric around the isolation structure, the first semiconductor nanostructure, and the second semiconductor nanostructure, wherein the gate dielectric extends continuously along a first sidewall of the isolation structure, a top surface of the first semiconductor nanostructure, a second sidewall of the isolation structure, and a bottom surface of the second semiconductor nanostructure, the first sidewall of the isolation structure being opposite the second sidewall of the isolation structure, wherein the first gate electrode and the second gate electrode are formed on the gate dielectric.

\* \* \* \* \*